(12) United States Patent  
Sakano et al.

(10) Patent No.: US 7,689,028 B2
(45) Date of Patent: Mar. 30, 2010

(54) METHOD AND APPARATUS FOR EVALUATING PROCESSING APPARATUS STATUS AND PREDICTING PROCESSING RESULT

(75) Inventors: Shinji Sakano, Nirasaki (JP); Satoshi Harada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1066 days.

(21) Appl. No.: 10/984,932

(22) Filed: Nov. 10, 2004

(65) Prior Publication Data

US 2005/0125090 A1 Jun. 9, 2005

Related U.S. Application Data

(63) Continuation of application No. PCT/JP03/05782, filed on May 8, 2003.

(30) Foreign Application Priority Data

May 16, 2002 (JP) .............................. 2002-142169
Jul. 2, 2002 (JP) .............................. 2002-193624

(51) Int. Cl.
*G06K 9/00* (2006.01)
(52) U.S. Cl. ........................ 382/145; 382/155; 340/604; 216/61; 700/108; 702/18
(58) Field of Classification Search ................ 382/145, 382/155; 700/108, 121; 702/18, 182; 216/61; 340/604
See application file for complete search history.

(56) References Cited

U.S. PATENT DOCUMENTS 4,584,508 A * 4/1986 Kobayashi et al. .......... 318/483

| 4,973,844 | A | * | 11/1990 | O'Farrell et al. | .......... 250/341.7 |
| 5,663,542 | A | * | 9/1997 | Kohr et al. | ................ 200/61.05 |
| 5,780,719 | A | * | 7/1998 | VanDam | ..................... 73/29.01 |
| 5,821,863 | A | * | 10/1998 | Schroder et al. | ............ 340/604 |
| 5,900,821 | A | * | 5/1999 | Petzold | ........................ 340/604 |
| 6,020,704 | A | * | 2/2000 | Buschur | ...................... 318/483 |
| 6,151,532 | A | * | 11/2000 | Barone et al. | ............... 700/121 |
| 6,197,116 | B1 | * | 3/2001 | Kosugi | ........................ 118/712 |
| 6,392,218 | B1 | * | 5/2002 | Kuehnle | ................... 250/208.1 |

(Continued)

FOREIGN PATENT DOCUMENTS

EP          1089146          4/2001

(Continued)

*Primary Examiner*—Daniel G Mariam
*Assistant Examiner*—Aklilu k Woldemariam
(74) *Attorney, Agent, or Firm*—Oblon, Spivak, McClelland, Maier & Neustadt, L.L.P.

(57) ABSTRACT

A method for predicting a processing result includes a process of performing a principal component analysis on a plurality of detected data obtained during a first standard processing, to construct a principal component analysis model; a process of obtaining residuals of the principal component analysis model as first residuals; a process of performing a second standard processing; and a process of obtaining a plurality of detected data from a plurality of detectors during the second standard processing. And, the detected data obtained during the second standard processing are applied to the principal component analysis model, to obtain second residuals. The method further includes a process of weighting the second residuals based on weighting references, and constructing a new multivariate analysis model with use of the weighted second residuals; and a process of predicting a processing result of the second standard processing with use of the multivariate analysis model.

22 Claims, 16 Drawing Sheets

U.S. PATENT DOCUMENTS

| | | |
|---|---|---|
| 6,535,785 B2 * | 3/2003 | Johnson et al. ............. 700/121 |
| 6,892,580 B2 * | 5/2005 | Pankey et al. ................. 73/570 |
| 2004/0007560 A1 | 1/2004 | Sakano et al. |
| 2004/0254761 A1 | 12/2004 | Sakano et al. |

FOREIGN PATENT DOCUMENTS

| | | |
|---|---|---|
| JP | 11-510898 | 9/1999 |
| JP | 2001-060585 | 3/2001 |
| JP | 2002-025981 | 1/2002 |
| WO | WO 97/07439 | 2/1997 |
| WO | WO 02/03441 | 1/2002 |
| WO | WO 03/003437 | 1/2003 |

* cited by examiner

METHOD AND APPARATUS FOR EVALUATING PROCESSING APPARATUS STATUS AND PREDICTING PROCESSING RESULT

This application is a Continuation Application of PCT International Application No. PCT/JP03/05782 filed on May 8, 2003, which designated the United States.

FIELD OF THE INVENTION

The present invention relates to a method and an apparatus for evaluating processing apparatus status and predicting processing result; and, more particularly, to a method and an apparatus for evaluating processing apparatus status and predicting processing result by using data detected from multiple detectors attached to a processing apparatus such as a semiconductor manufacturing apparatus or a semiconductor inspection apparatus.

BACKGROUND OF THE INVENTION

In a semiconductor manufacturing process, various kinds of semiconductor manufacturing apparatuses or semiconductor inspection apparatuses may be employed. For example, a plasma processing apparatus is used for a plasma processing such as an etching process or a film forming process. These kinds of plasma processing apparatus include an upper electrode and a lower electrode, which are arranged to be parallel with each other in a processing chamber. If a high frequency power is applied to the lower electrode and a processing gas is introduced into the processing chamber, a plasma of the processing gas is generated by discharging between the upper and lower electrodes. As a result, a predetermined plasma processing is performed on an object to be processed (e.g., a wafer).

For evaluating whether or not an abnormality exists in the process of the plasma processing apparatus, 30 or so kinds of data are detected with use of respective detectors, wherein the detected data include a plasma emission intensity, a pressure in the processing chamber, a power applied to the lower electrode, a supplying flow rate of the processing gas, and etc. The respective detected values are collected as operating data, which are used to perform a multivariate analysis such as principal component analysis. Accordingly, the process of the plasma processing apparatus is evaluated.

For example, after processing multiple wafers, a plurality of operating data is obtained for each of the wafers. For example, a graph shown in FIG. 12 can be obtained by, e.g., gathering 3 kinds of operating data for each of the wafers and plotting the operating data. In the graph shown in FIG. 12, the operating data show a regular trend, namely, most of the operating data are enclosed in a Rugby-ball-shaped space. Thus, if a principal component analysis is performed on the operating data to obtain first and second principal components, the first principal component becomes the line coordinate ① which has the largest variance and is approximately identical to the major axis of the Rugby-ball-shaped space, while the second principal component becomes the line coordinate ② which has second largest variance and is approximately identical to the minor axis of the Rugby-ball-shaped space. The line coordinate ① and the line coordinate ② are orthogonal to each other. Then, the process of the plasma processing apparatus etc. is evaluated by using, e.g., the first principal component.

However, as can be seen clearly in FIG. 12, there are operating data that are outside the Rugby-ball-shaped space such as points A and B, for example. These operating data are considered to be outside the normal operating data. Thus, some abnormality is considered to exist in the plasma processing apparatus.

As a method for investigating the cause of such abnormality, the applicants have proposed a method for investigating the cause of an abnormality of a plasma processing apparatus by using a residual matrix in a principal component analysis in Japanese Patent Laid-Open Application No. 2002-25981. In the method, values, which are detected by multiple detectors while processing multiple sample wafers, are employed as operating data, and a model equation is constructed by performing a principal component analysis on the operating data. Then, principal components with high degrees are merged to obtain a residual matrix, whose components (residuals) are used to inspect the abnormality of the plasma processing apparatus. Further, by obtaining a sum of squares of respective components of the residual matrix (a residual score), the abnormality of the plasma processing apparatus can be recognized by using a magnitude of difference between a base line (average level line) of residual scores for respective wafers in a case where a standardized processing apparatus is employed, and a base line of residual scores in a case where another plasma processing apparatus is employed.

However, the abnormality inspection method of Japanese Patent Laid-Open Application No. 2002-25981 is problematic when operating data are collected by processing multiple training wafers by using a processing apparatus after a maintenance procedure such as cleaning, and then the operating data are applied, in order to obtain a residual score, to the principal component analysis model equation, which is obtained by using the processing apparatus before cleaning. In that case, as shown in FIG. 13, even if the processing apparatus after the cleaning is in a normal status, the base line ②, which is formed by residual scores for respective wafers after the maintenance, migrates from the base line ①, which is formed by residual scores for respective wafers before the maintenance, to exceed the abnormality determination line L, thereby determining that the process of the processing apparatus is abnormal. As such, an abnormality cannot be properly checked for every wafer in such a case. Further, it is recognized that as the maintenance such as cleaning is repeated, the base lines ③ and ④ slowly shift upward from the base line ② and the abnormality becomes unidentifiable. In this case, the graph shown in FIG. 13 is obtained as follows: first, plasma emission intensities in multiple component wavelengths within a predetermined range of wavelength are employed as operating data, wherein the plasma emission intensities are detected by an endpoint detector; then an average of residual scores, of the emission intensities in all component wavelengths, is calculated for each of the wafers; and finally the average of the residual scores is plotted for each of the wafers.

Further, in a semiconductor manufacturing process, many kinds of semiconductor manufacturing apparatuses or semiconductor inspection apparatuses may be employed. For example, a plasma processing apparatus is used for a plasma processing such as etching or film forming processes. These kinds of plasma processing apparatus include an upper electrode and a lower electrode, which are arranged to be parallel with each other in a processing chamber. If high frequency powers are applied to the upper and lower electrodes under the control of a control device and a processing gas is introduced into the processing chamber, a plasma of the processing gas is generated by a discharge between the upper and lower electrodes. While emission intensities of the plasma are monitored by using an endpoint detector, a predetermined plasma processing is performed on an object to be processed (e.g., a wafer). Here, controllable parameters, such as a pressure in the processing chamber, high frequency powers for the upper and lower electrodes, a flow rate of the processing gas, and etc., (hereinafter, referred to as "process parameters") are set to be a standard condition. While processing the wafer, plasma emission intensities etc. are detected with a plurality of detectors, such as an endpoint detector etc., which are attached to the plasma processing apparatus.

Thereafter, a model equation for predicting the process is constructed based on multiple detected data with a multivariate analysis program that is stored in the control device. With the model equation, a status of the plasma processing apparatus is evaluated or a processing result is predicted. For constructing the model equation, detected data from a plurality of detectors are collected, and a correlation equation between the detected data and the process parameters is obtained by a multiple regression analysis. By applying detected data to the model equation constructed by the multiple regression analysis, process parameters can be predicted.

For constructing the model equation, first of all, a predetermined number of wafers, e.g., 7 wafers, are arranged in the processing chamber of the plasma processing apparatus. Then, the wafers are processed under the process parameters, such as the pressure in the processing chamber, the high frequency powers for the upper and lower electrodes, the flow rate of the processing gas, and etc., being set to be at a standard condition (normal condition which has been set previously depending on the processing details). While processing the wafers, plasma emission intensities (optical data) in multiple component wavelengths are detected by an endpoint detector as detected data. The wafers processed in the standard condition are defined as normal wafers.

Thereafter, for example, 12 wafers are processed after changing multiple process parameters within a predetermined range from the standard condition. Then, multiple optical data are detected as detected data for each of the wafers. In varying (changing) the process parameters, an orthogonal experiment employing orthogonal arrays of Taguchi method is performed. The wafers used for the orthogonal experiment are defined as orthogonal arrays wafers.

Using the detected data from the normal wafers and the orthogonal arrays wafers, a multiple regression analysis, such as shown in FIG. 15, is performed. That is, the following model equation is constructed by performing a multiple regression analysis by using the multiple detected data including the optical data as explanatory variables $x_{ij}$ (i being the wafer number, j being the sample number of the component wavelengths) and the process parameters, such as the pressure of the processing gas in the processing chamber, the high frequency powers and the flow rate of the processing gas, as objective variables $y_{ij}$. For constructing the model equation, the partial least squares (PLS) method, which can be used to obtain the correlation between the matrices X and Y with only a few data, is employed to obtain the matrix B. The details of the PLS method is published in, e.g., JOURNAL OF CHEMOMETRICS, VOL. 2(PP. 211-228) (1998). Further, in the following model equation, X is a matrix whose components include explanatory variables, B is a matrix whose components include multiple regression coefficients, and Y is a matrix whose components include objective variables.

$$Y=BX$$

After the model equation is constructed, normal wafers and abnormal wafers (wafers that are processed in a changed condition wherein the process parameters are varied in a upward or downward direction from the standard condition) are processed, and the process parameters are predicted with use of data detected while processing the wafers. That is, 7 wafers are processed as normal wafers in the process parameters set to be the standard condition, while 15 wafers are processed as abnormal wafers in a condition wherein the process parameters are varied in a upward or downward direction from the standard condition. Meanwhile, plasma emission intensities in multiple component wavelengths are detected by an endpoint detector as detected data. Then, the multiple process parameters are calculated based on the model equation and the detected data, and the calculated values are automatically outputted as predicted values.

FIG. 16 shows a comparison between set values and predicted values of a process parameter for respective wafers before and after a cleaning procedure. The left half of FIG. 16 shows set values and predicted values of a flow rate of gas 1 in case of the plasma processing apparatus before the cleaning, where the model equation is constructed. The right half of FIG. 16 shows set values and predicted values (with use of the model equation) of the flow rate of the gas 1 in case of the plasma processing apparatus after the cleaning. As can be clearly seen in FIG. 16, when the plasma processing apparatus before the cleaning where the model equation is constructed, the predicted values are near to the setting values, that is, the prediction accuracy is relatively high.

However, as for the plasma processing apparatus after the cleaning, the predicted values diverge away from the setting values. That is, if the model equation constructed before the cleaning is used intact, the process parameters for the plasma processing apparatus after the cleaning cannot be predicted. Even with a single plasma processing apparatus, detected data would change after a cleaning due to re-attachment of an endpoint detector, environmental changes in a processing chamber, and etc. Therefore, it is necessary that the model equation should be reconstructed after the cleaning. The above is not limited to a single plasma processing apparatus before and after cleaning, but is similar when another maintenance procedure and between separate plasma processing apparatuses of same kind.

SUMMARY OF THE INVENTION

It is, therefore, a primary object of the present invention to provide a method for evaluating an abnormality of a processing apparatus, which is capable of inspecting the abnormality of the processing apparatus reliably not only before a maintenance procedure, such as cleaning, but also after the maintenance.

The present inventors investigated extensively for reasons why an abnormality cannot be detected for a processing apparatus after a cleaning procedure. Based on the result, it has been recognized that the reason was because the components in the processing chamber and/or the detectors are detached, respectively maintained, and re-attached during the maintenance such as cleaning, and because surfaces of components in a processing chamber are contaminated, and attachment statuses of the components or detected values from detectors change in every attachment as a result.

The present inventors found that a variation of an abnormality determination line can be suppressed by applying a specific statistical method on operating data, which are gathered from the respective detectors attached to the processing apparatus after a maintenance, for obtaining residual scores based on the operating data.

It is another object of the present invention to provide a method and an apparatus for predicting a processing result, after a prediction equation has been once constructed for a processing apparatus, by evaluating an apparatus status, such as process parameters, with use of the prediction equation even for another processing apparatus of the same kind.

In accordance with a preferred embodiment of the invention, there is provided a method for predicting a processing result, including a process of performing a predetermined first standard processing on a plurality of objects to be processed with use of a first processing apparatus set in a certain condition; a process of obtaining a plurality of detected data from a plurality of detectors provided at the first processing apparatus during the first standard processing; a process of performing a certain multivariate analysis with use of the plurality of detected data obtained during the first standard processing, to set weighting references for the plurality of detected data; a process of performing a second standard processing, which is similar to the first standard processing, on a plurality of objects to be processed, which are similar to said the plurality of objects to be processed, with use of the first processing apparatus in another condition or another second processing apparatus of the same kind; a process of obtaining a plurality of detected data from the plurality of detectors provided at the first processing apparatus or from a plurality of detectors provided at the second processing apparatus during the second standard processing; a process of weighting the plurality of detected data obtained during the second standard processing based on the weighting references, and applying the weighted plurality of detected data to the multivariate analysis; and a process of predicting a processing result of the second standard processing based on a result of the application to the multivariate analysis.

In accordance with another preferred embodiment of the invention, there is provided a method for predicting a processing result, including a process of performing a predetermined first standard processing on a plurality of objects to be processed with use of a first processing apparatus set in a certain condition; a process of obtaining a plurality of detected data from a plurality of detectors provided at the first processing apparatus during the first standard processing; a process of performing a principal component analysis on the plurality of detected data obtained during the first standard processing, to construct a principal component analysis model; a process of obtaining residuals of the principal component analysis model as first residuals; a process of performing a second standard processing, which is similar to the first standard processing, on a plurality of objects to be processed, which are similar to said the plurality of objects to be processed, with use of the first processing apparatus in another condition or another second processing apparatus of the same kind; a process of obtaining a plurality of detected data from the plurality of detectors provided at the first processing apparatus or from a plurality of detectors provided at the second processing apparatus during the second standard processing; a process of applying the plurality of detected data obtained during the second standard processing to the principal component analysis model, to obtain second residuals; a process of comparing the first residuals and the second residuals, to set weighting references for the respective second residuals; a process of weighting the second residuals based on the weighting references, and constructing a new multivariate analysis model with use of the weighted second residuals; and a process of predicting a processing result of the second standard processing with use of the multivariate analysis model.

In accordance with still another preferred embodiment of the invention, there is provided a method for evaluating a processing apparatus condition including a process of performing a predetermined first standard processing on a plurality of objects to be processed with use of a first processing apparatus set in a certain condition; a process of obtaining a plurality of detected data from a plurality of detectors provided at the first processing apparatus during the first standard processing; a process of performing a certain multivariate analysis with use of the plurality of detected data obtained during the first standard processing, to set weighting references for the plurality of detected data; a process of performing a second standard processing, which is similar to the first standard processing, on a plurality of objects to be processed, which are similar to said the plurality of objects to be processed, with use of the first processing apparatus in another condition or another second processing apparatus of the same kind; a process of obtaining a plurality of detected data from the plurality of detectors provided at the first processing apparatus or from a plurality of detectors provided at the second processing apparatus during the second standard processing; a process of weighting the plurality of detected data obtained during the second standard processing based on the weighting references, and applying the weighted plurality of detected data to the multivariate analysis; and a process of evaluating an apparatus condition of the first processing apparatus or the second processing apparatus during the second standard processing based on a result of the application to the multivariate analysis.

In accordance with further still another preferred embodiment of the invention, there is provided a method for evaluating a processing apparatus condition, including a process of performing a predetermined first standard processing on a plurality of objects to be processed with use of a first processing apparatus set in a certain condition; a process of obtaining a plurality of detected data from a plurality of detectors provided at the first processing apparatus during the first standard processing; a process of performing a principal component analysis on the plurality of detected data obtained during the first standard processing, to construct a principal component analysis model; a process of obtaining residuals of the principal component analysis model as first residuals; a process of performing a second standard processing, which is similar to the first standard processing, on a plurality of objects to be processed, which are similar to said the plurality of objects to be processed, with use of the first processing apparatus in another condition or another second processing apparatus of the same kind; a process of obtaining a plurality of detected data from the plurality of detectors provided at the first processing apparatus or from a plurality of detectors provided at the second processing apparatus during the second standard processing; a process of applying the plurality of detected data obtained during the second standard processing to the principal component analysis model, to obtain second residuals; a process of comparing the first residuals and the second residuals, to set weighting references for the respective second residuals; a process of weighting the second residuals based on the weighting references, and constructing a new multivariate analysis model with use of the weighted second residuals; and a process of evaluating an apparatus condition of the first processing apparatus or the second processing apparatus during the second standard processing with use of the multivariate analysis model.

In accordance with another aspect of the invention, there is provided an apparatus for predicting a processing result, including a unit for, while performing a predetermined first standard processing on a plurality of objects to be processed with use of a first processing apparatus set in a certain condition, performing a certain multivariate analysis, with use of a plurality of detected data obtained from a plurality of detectors provided at the first processing apparatus, to set weighting references for the plurality of detected data; a unit for, while performing a second standard processing, which is similar to the first standard processing, on a plurality of objects to be processed, which are similar to said the plurality of objects to be processed, with use of the first processing apparatus in another condition or another second processing apparatus of the same kind, weighting a plurality of detected data, obtained from the plurality of detectors provided at the first processing apparatus or from a plurality of detectors provided at the second processing apparatus, and applying the weighted plurality of detected data to the multivariate analysis; and a unit for predicting a processing result of the second standard processing based on a result of the application to the multivariate analysis.

In accordance with another preferred embodiment of the aspect of the invention, there is provided an apparatus for predicting a processing result, including a unit for, while performing a predetermined first standard processing on a plurality of objects to be processed with use of a first processing apparatus set in a certain condition, performing a principal component analysis on a plurality of detected data obtained from a plurality of detectors provided at the first processing apparatus, to construct a principal component analysis model; a unit for obtaining residuals of the principal component analysis model as first residuals; a unit for, while performing a second standard processing, which is similar to the first standard processing, on a plurality of objects to be processed, which are similar to said the plurality of objects to be processed, with use of the first processing apparatus in another condition or another second processing apparatus of the same kind, applying a plurality of detected data, obtained from the plurality of detectors provided at the first processing apparatus or from a plurality of detectors provided at the second processing apparatus, to the principal component analysis model, to obtain second residuals; a unit for comparing the first residuals and the second residuals, to set weighting references for the respective second residuals; a unit for weighting the second residuals based on the weighting references, and constructing a new multivariate analysis model with use of the weighted second residuals; and a unit for predicting a processing result of the second standard processing with use of the multivariate analysis model.

In accordance with still another preferred embodiment of the aspect of the invention, there is provided an apparatus for evaluating a processing apparatus condition, including a unit for, while performing a predetermined first standard processing on a plurality of objects to be processed with use of a first processing apparatus set in a certain condition, executing a certain multivariate analysis, with use of a plurality of detected data obtained from a plurality of detectors provided at the first processing apparatus, to set weighting references for the plurality of detected data; a unit for, while performing a second standard processing, which is similar to the first standard processing, on a plurality of objects to be processed, which are similar to said the plurality of objects to be processed, with use of the first processing apparatus in another condition or another second processing apparatus of the same kind, weighting a plurality of detected data, obtained from the plurality of detectors provided at the first processing apparatus or from a plurality of detectors provided at the second processing apparatus, and applying the weighted plurality of detected data to the multivariate analysis; and a unit for evaluating an apparatus condition of the first processing apparatus or the second processing apparatus during the second standard processing based on a result of the application to the multivariate analysis.

In accordance with further still another preferred embodiment of the aspect of the invention, there is provided an apparatus for evaluating a processing apparatus condition, including a unit for, while performing a predetermined first standard processing on a plurality of objects to be processed with use of a first processing apparatus set in a certain condition, performing a principal component analysis on a plurality of detected data obtained from a plurality of detectors provided at the first processing apparatus, to construct a principal component analysis model; a unit for obtaining residuals of the principal component analysis model as first residuals; a unit for, while performing a second standard processing, which is similar to the first standard processing, on a plurality of objects to be processed, which are similar to said the plurality of objects to be processed, with use of the first processing apparatus in another condition or another second processing apparatus of the same kind, applying a plurality of detected data, obtained from the plurality of detectors provided at the first processing apparatus or from a plurality of detectors provided at the second processing apparatus, to the principal component analysis model, to obtain second residuals; a unit for comparing the first residuals and the second residuals, to set weighting references for the respective second residuals; a unit for weighting the second residuals based on the weighting references, and constructing a new multivariate analysis model with use of the weighted second residuals; and a unit for evaluating an apparatus condition of the first processing apparatus or the second processing apparatus during the second standard processing with use of the multivariate analysis model.

DETAILED DESCRIPTION OF THE PREFERRED EMBODIMENTS

Hereinafter, the present invention is explained based on a first preferred embodiment thereof shown in FIGS. 1 to 7.

First, an example of plasma processing apparatus, which is used for an abnormality inspection method in accordance with the first preferred embodiment of the present invention, is explained with reference to FIG. 1. An abnormality of the plasma processing apparatus means a status wherein a processing condition, such as a flow rate of a processing gas, a pressure in a processing chamber, high frequency powers, and etc., deviates from a center processing condition, and wherein, therefore, a proper processing cannot be executed on an object to be processed (e.g., a wafer), thereby producing defects on the processed wafer. Here, the extent of the defects is not particularly limited.

Figure 1:
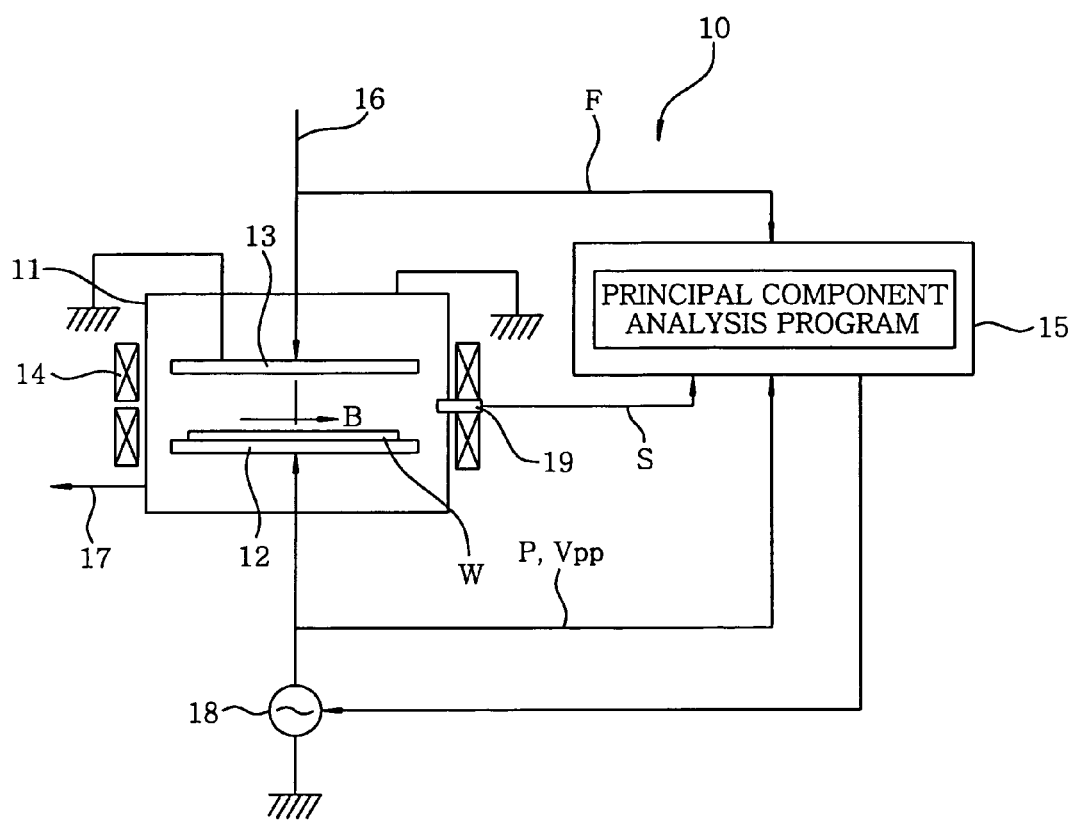
FIG. 1 shows an outline configuration of an example of a plasma processing apparatus, to which an abnormality inspection method in accordance with a first preferred embodiment of the present invention is applied.

As shown in FIG. 1, for example, the plasma processing apparatus 10, which is used in the present preferred embodiment, includes a processing chamber 11, which is made of a conductive material such as aluminum; a lower electrode 12 which is arranged on a lower surface of the processing chamber 11, and which also functions as a mounting table to mount a wafer W as an object to be processed; a hollow-shaped and grounded upper electrode 13 which is arranged with a predetermined gap above the lower electrode 12, and which functions as a processing gas supply unit; and a magnetic field forming unit 14 which provides a rotating magnetic field. If a rotating magnetic field B acts on an electric field that is generated between the upper and lower electrodes in the processing chamber 11 under the control of a control device 15, a high-density plasma is generated to perform a uniform plasma processing on the wafer W. At a top surface of the processing chamber 11, a gas supply line 16 that communicates with the upper electrode 13 is connected. Through the gas supply line 16 and the upper electrode 13, a processing gas is supplied into the processing chamber 11 from a gas supply source (not shown). At a side surface of the processing chamber 11, a gas discharge line 17 being coupled with a vacuum exhaust device (not shown) is connected. With the vacuum exhaust device and the gas discharge line 17, an interior of the processing chamber 11 is depressurized and maintained at a predetermined vacuum level. To the lower electrode 12, a high frequency power supply 18 is connected. If a high frequency power is applied from the high frequency power supply 18 to the lower electrode 12, the plasma of the processing gas is generated between both of the electrodes 12 and 13. As a result, a predetermined processing, e.g., etching processing is performed on a surface of the semiconductor wafer W mounted on the lower electrode 12.

To the plasma processing apparatus 10, for example, 36 different kinds of detectors such as an endpoint detector 19 etc. are attached. With use of these detectors, e.g., a plasma emission intensity S, a high frequency power Vpp, a high frequency power P, a flow rate F of a processing gas, and etc. are detected one by one as operating data during a plasma processing (e.g., surface etching). The respective detected values are taken into the control device 15 individually. In the control device 15, a program for, e.g., a principal component analysis is stored as a multivariate analysis program. With the program, a principal component analysis is performed, and an abnormality of the plasma processing apparatus 10 is inspected (determined). In the principal component analysis, residual scores are obtained and the abnormality is inspected based on the residual scores.

However, as described above, after various components or detectors are detached and re-attached in the maintenance such as the cleaning etc., detected values often change, i.e., identical operating data with those before maintenance often cannot be obtained.

Therefore, in the present preferred embodiment, in obtaining a residual score after the maintenance, some operating data are selected with a specific method, and the residual score is calculated by using only the selected operating data. Since an influence of variation of detected values from respective detectors, which are caused by the maintenance procedure such as cleaning etc., are mitigated by the manipulation, the method in accordance with the present preferred embodiment can reliably inspect an abnormality of the plasma processing apparatus 10.

Prior to a detailed explanation for the abnormality inspection method in accordance with the present preferred embodiment, briefly explained is a principal component analysis employing plasma emission intensity S that is detected by an endpoint detector 19.

First, with use of the plasma processing apparatus 10 before cleaning, a plasma processing is previously performed on, e.g., 30 sample wafers (a training set) that become a standard set. Meanwhile, emission intensities in n component wavelengths, which are detected by the endpoint detector 19, are detected one by one as operating data for each of the wafers. By performing a principal component analysis of the operating data, an abnormality of the plasma processing apparatus 10 is determined. For example, if n detected values x exist for each of m wafers, a matrix including the operating data is expressed as Eq. 1.

$$X = \begin{bmatrix} x_{11} & x_{12} & \cdots & x_{1n} \\ x_{21} & x_{22} & \cdots & x_{2n} \\ \vdots & \vdots & \cdots & \vdots \\ x_{m1} & x_{m2} & \cdots & x_{mn} \end{bmatrix} \quad \text{Eq. 1}$$

In the control device 15, the average value, the maximum value, the minimum value and the variance for each of the detected values are calculated. Thereafter, with use of a variance-covariance matrix based on the calculated values, a principal component analysis on multiple operating data is performed, to obtain eigenvalues and eigenvectors thereof.

The eigenvalue indicates the magnitude of the variance of respective operating data. Then, the first principal component, the second principal component, ... and the $n^{th}$ principal component are defined in the decreasing order of the eigenvalue. Further, each of the eigenvalues has an eigenvector associated thereto. In general, as the degree of the principal component increases (as the eigenvalue decreases), a contribution rate for an evaluation of data becomes lower, and the usefulness decreases.

As described above, if n detected values are adopted for each of m wafers, the $j^{th}$ principal component $t_{ij}$ corresponding to the $j^{th}$ eigenvalue for the $i^{th}$ wafer is expressed as Eq. 2.

$$t_{ij} = X_{i1}P_{j1} + X_{i2}P_{j2} + \ldots + X_{in}P_{jn} \quad \text{Eq. 2}$$

Then, the value, obtained by assigning the concrete detected values for $i^{th}$ wafer ($x_{i1}, x_{i2}, \ldots, x_{in}$) to the equation of the $j^{th}$ principal component $t_{ij}$, becomes a score for the $j^{th}$ principal component of the $i^{th}$ wafer. Therefore, the score for the $j^{th}$ principal component $t_j$ is defined by Eq. 3, and the eigenvector for the $j^{th}$ principal component $P_j$ is defined by Eq. 4.

$$t_j = \begin{bmatrix} t_{1j} \\ t_{2j} \\ \vdots \\ t_{mj} \end{bmatrix} \quad \text{Eq. 3}$$

$$P_j = \begin{bmatrix} P_{j1} \\ P_{j2} \\ \vdots \\ P_{jn} \end{bmatrix} \quad \text{Eq. 4}$$

The score for the $j^{th}$ principal component $t_j$ can be expressed as Eq. 5 with use of the matrix X and the eigenvector $P_j$. Further, the matrix X can be expressed as Eq. 6 with use of scores for the principal components $t_i$ and the respective eigenvectors $P_i$ of them.

$$t_j = XP_j \quad \text{Eq. 5}$$

$$X = t_1 P_1^T + t_2 P_2^T + \ldots + t_n P_n^T \quad \text{Eq. 6,}$$

wherein $P_n^T$ is a transposed matrix for $P_n$.

Meanwhile, when determining an abnormality in the process of the plasma processing apparatus 10 as described above, a residual matrix is constructed by merging high-degree principal components after a principal component analysis is performed. A principal component analysis is performed for principal components, e.g., up to the $k^{th}$ one, which are considered to have high contribution rates, and principal components with a high degree being greater than k, which have lower contribution rates than that of the $k^{th}$ principal component, are merged to construct the residual matrix E defined in Eq. 7, wherein each column corresponds to each component wavelength of emission spectrum, and each row corresponds to the number of wafers.

$$E = \begin{bmatrix} e_{11} & e_{12} & \cdots & e_{1n} \\ e_{21} & e_{22} & \cdots & e_{2n} \\ \vdots & \vdots & \cdots & \vdots \\ e_{m1} & e_{m2} & \cdots & e_{mn} \end{bmatrix} \quad \text{Eq. 7}$$

By applying the residual matrix E to Eq. 6, Eq. 6 is expressed by Eq. 8. With use of a row vector $e_i$ defined by Eq. 9, the residual scores $Q_i$ of the residual matrix E can be expressed by a product of the row vector $e_i$ and a vector $e_i^T$ that is a transposed matrix thereof, as defined by Eq. 10. The residual score $Q_i$ is an index indicating residuals (errors) among respective detected values for the $i^{th}$ wafer. As shown in Eq. 10, the residual score $Q_i$ is a sum of squares of respective residuals, and becomes a reliable residual without offsetting their plus components and minus components.

$$X = t_1 P_1^T + t_2 P_2^T + \ldots + t_k P_k^T + E \quad \text{Eq. 8}$$

$$e_i = [e_{i1} e_{i2} \ldots e_{in}] \quad \text{Eq. 9}$$

$$Q_i = e_i e_i^T = \sum_{j=1}^{n} (e_{ij})^2 \quad \text{Eq. 10}$$

In the present preferred embodiment, by calculating the residual score $Q_i$ for each of the wafers, the abnormality of the process is determined. With use of the residual matrix E and the residual scores $Q_i$ thereof, weights of operating data as statistical data are evaluated from multiple positions, and thereby it is possible to determine the abnormality of the process that cannot be wholly captured by only the first to $k^{th}$ components.

Eq. 10 can be expressed with the following Eq. 11, wherein $W_j$ is a weight that is generally in the range of $0 \leq W_j \leq 1$. In the present preferred embodiment, weights $W_j$ of used component wavelengths are 1, while weights $W_j$ of unused component wavelengths are 0. That is, by setting the weights $W_j$ to be 1 or 0, used components wavelengths are properly selected in accordance with wavelength characteristics detected by an endpoint detector 19. Accordingly, the residual scores $Q_i$ can be set with more variety.

$$Q_i = \sum_{j=1}^{n} W_j (e_{ij})^2 \quad \text{Eq. 11}$$

Figure 14:
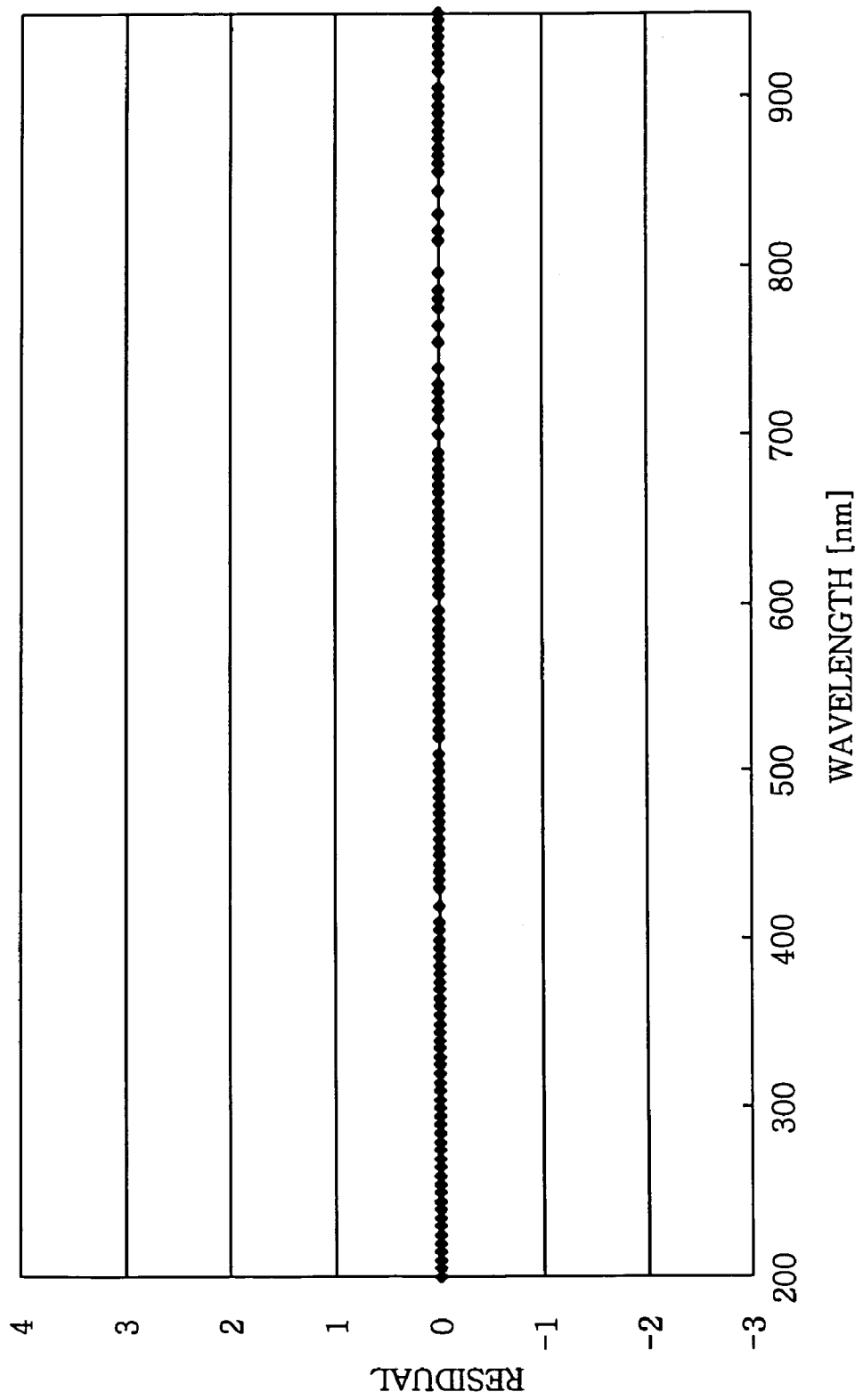
FIG. 14 shows a relationship of component wavelengths and residuals in each of the component wavelengths for a plasma processing apparatus which is used before cleaning.
Figure 15:
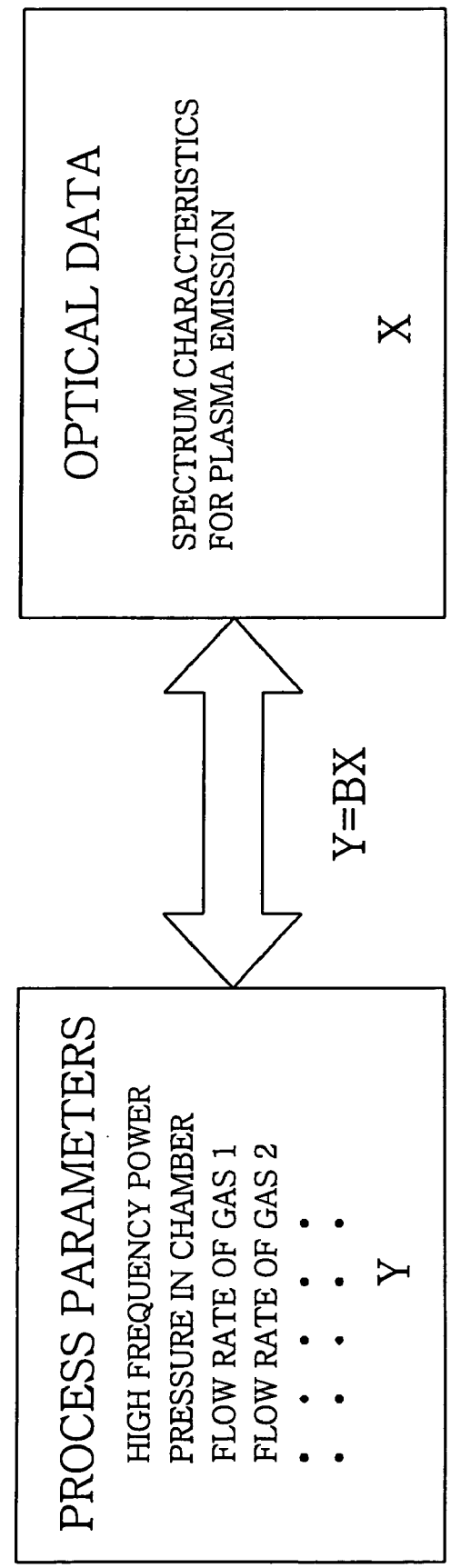
FIG. 15 represents a method for constructing a model that is used in a conventional process prediction method.
Figure 16:
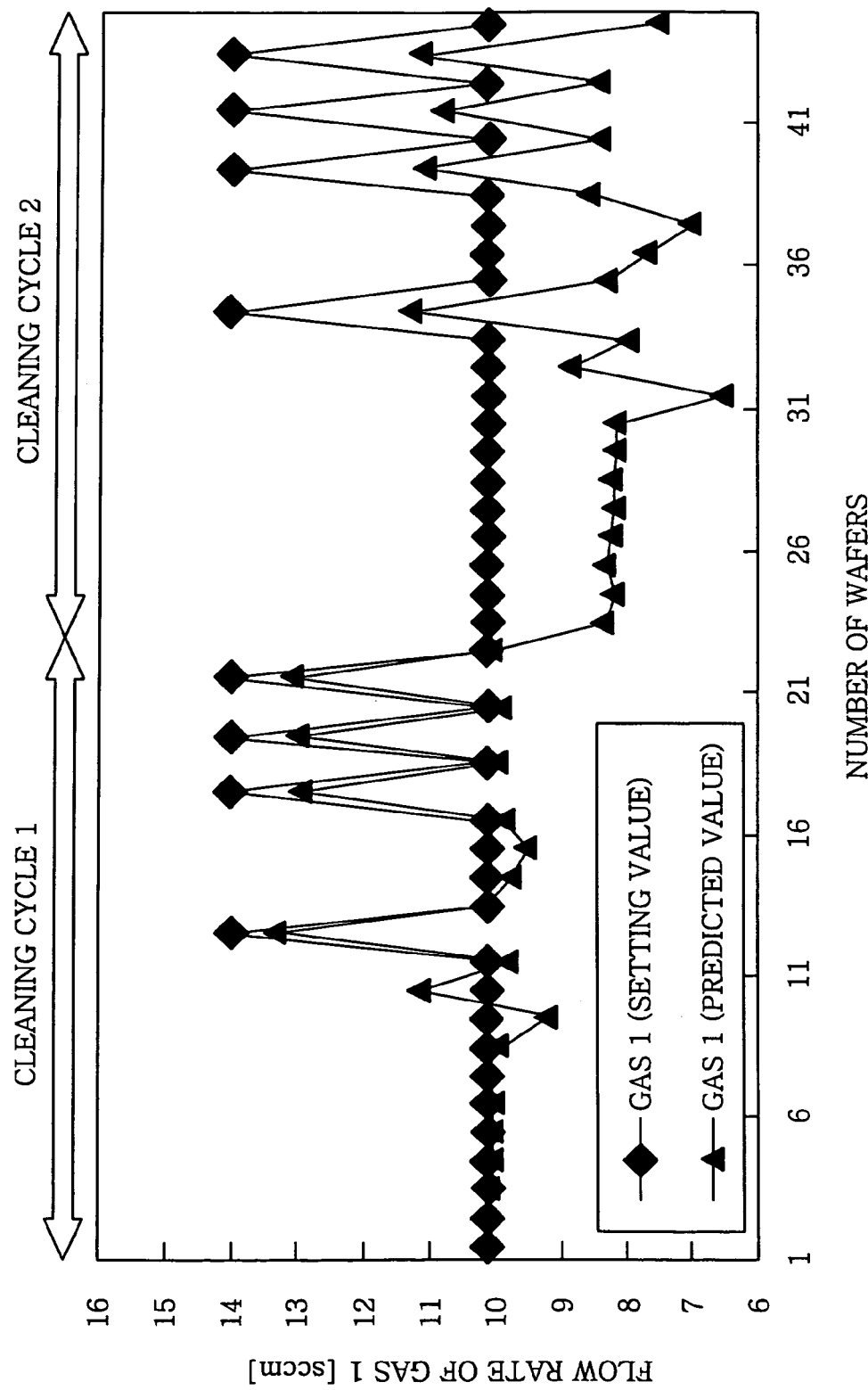
FIG. 16 shows set values and predicted values of a process parameter of a plasma processing apparatus before and after a cleaning procedure, the predicted values being predicted with use of the conventional process prediction method.

In an experiment in accordance with the present preferred embodiment, 600 wafers were processed with the following processing condition (a standard processing condition for etching the following wafers, i.e., a center condition). Plasma emission intensities in component wavelengths (e.g., 128 components with 5 nm pitch in a range of 200 nm~950 nm) for each of the wafers were respectively detected as first operating data. By performing a principal component analysis of the first operating data, first to $5^{th}$ principal components (k=5) were obtained, and residual scores Qi for respective wafers were obtained with use of Eq. 10. In this case, an average of residuals for each of the component wavelengths was approximately 0 as shown in FIG. 14, and the maximum value among 128×600 residuals was +1.81 while the minimum value was −0.58.

[Processing Condition]
processing apparatus: a magnetron RIE processing apparatus
wafer: 300 mm
etching film: silicon oxide film
base layer: silicon film
processing details: formation of a contact hole
high frequency and power of power supply for lower electrode: 13.56 MHz, 4000 W
processing pressure: 50 mTorr
processing gas: $C_4F_8$=20 sccm, CO=100 sccm, Ar=440 sccm, $O_2$=10 sccm
backside gas: He=10 mTorr (central portion of electrode), 50 mTorr (edge portion of electrode)
DC voltage on electrostatic chuck: 2.5 KV
Processing temperature: upper electrode=60° C., sidewall=60° C., lower electrode=20° C.

Figure 2:
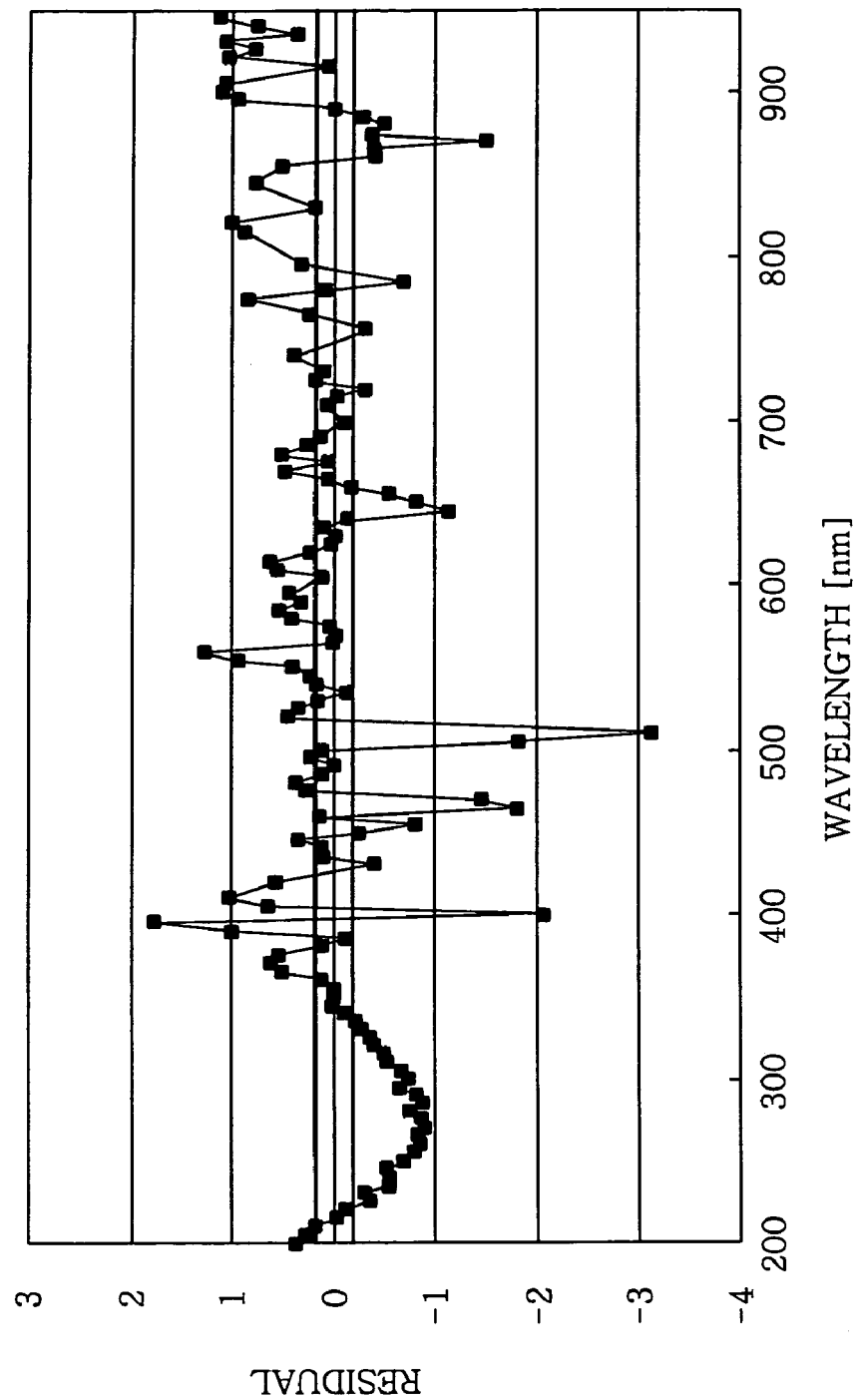
FIG. 2 shows residual variations in respective component wavelengths of plasma emission within a wavelength range of 200 nm~950 nm, wherein the plasma emission is detected by an endpoint detector attached to the plasma processing apparatus after a cleaning procedure in accordance with the first preferred embodiment.
Figure 13:
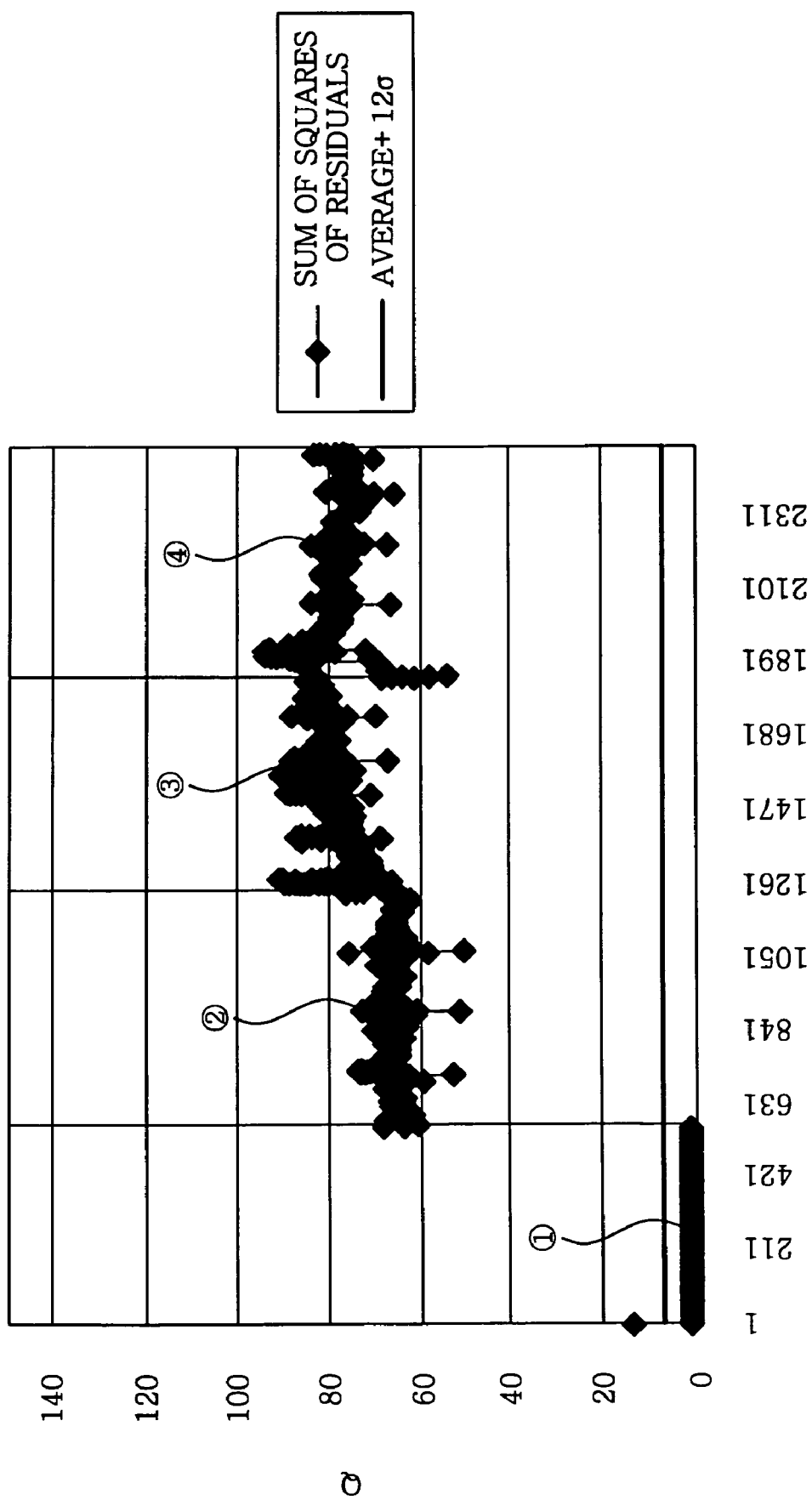
FIG. 13 presents a relationship between the number of processed wafers and a residual score in all component wavelengths, and shows a variation of the residual score before and after the cleaning.

Next, the plasma processing apparatus 10, with which the principal component analysis of the first operating data had been performed to construct the model equation, was subjected to cleaning. Thereafter, 600 wafers were processed under the above processing condition with use of the plasma processing apparatus 10 after the cleaning. The plasma emission intensities in respective component wavelengths were applied as the second operating data to the model equation that had been obtained before the cleaning, and averages of residuals for the 600 wafers in respective component wavelengths were plotted. The result is shown in FIG. 2. As shown in FIG. 2, the averages of the residuals were largely biased in plus or minus direction. If a residual score Q is obtained for all the component wavelengths based on the residuals, as shown in FIG. 13 with ②~④, the residual score Q increases for every cleaning cycle to exceed an abnormality determination line L, i.e., it is impossible to determine an abnormality.

Figure 3:
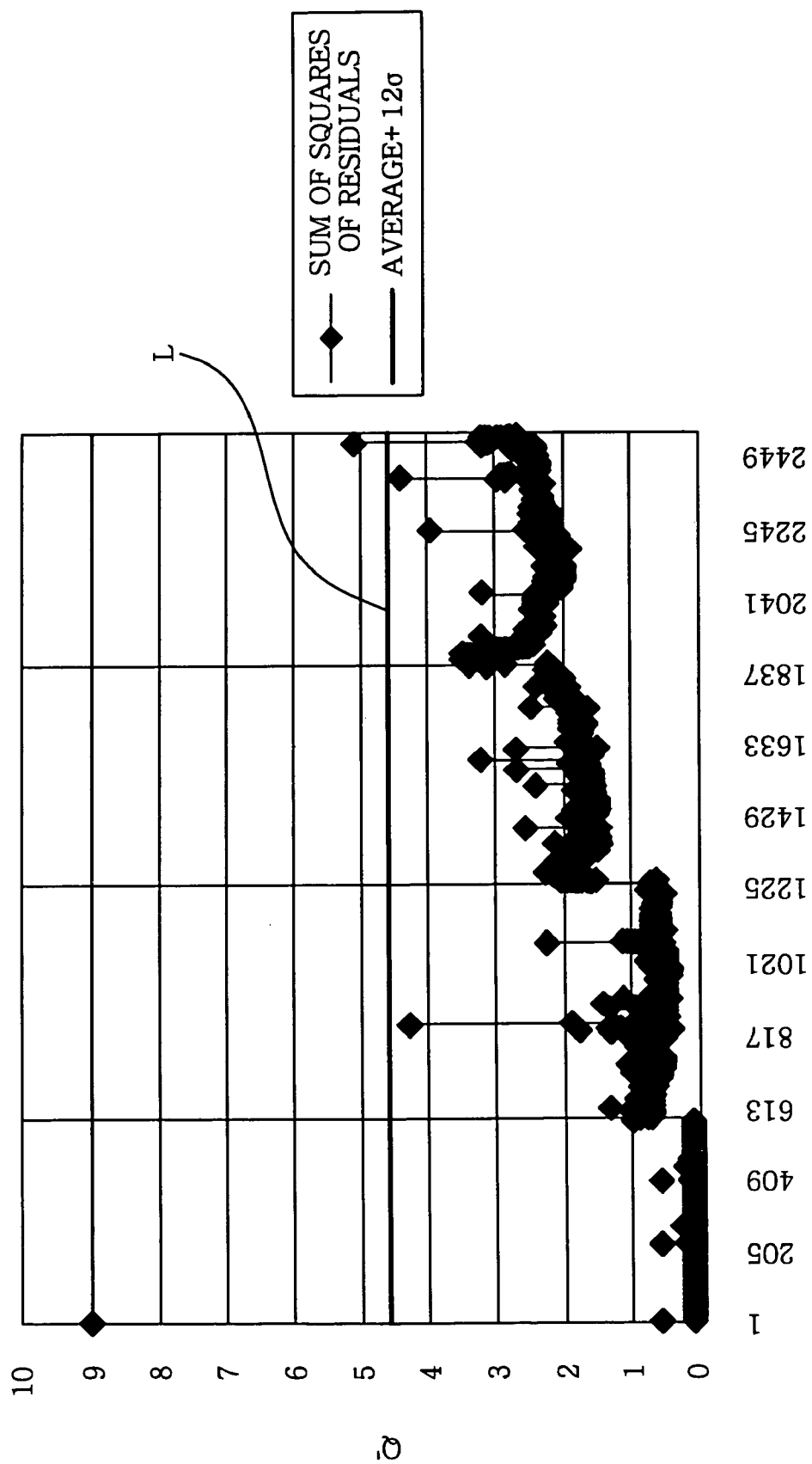
FIG. 3 shows a relationship between the number of processed wafers and a residual score, in a plurality of component wavelengths with low residual variations, for each of the wafers, and shows a variation of the residual score before and after the cleaning, in accordance with the first preferred embodiment.

For this reason, in the present preferred embodiment, only component wavelengths with relatively small residual variations in consideration of the maximum value and the minimum value of the residuals are selected, and residual scores Q' for the respective wafers are calculated only with use of the selected component wavelengths. For example, in the example shown in FIG. 2, only 40 component wavelengths, which show residual variations within the range of ±0.2, about 10% of 1.81, which is the maximum absolute value among the residuals for respective component wavelengths before the cleaning, were selected out of the 128 component wavelengths. A residual score Q' thereof are obtained and plotted for each of the wafers. The result is shown in FIG. 3. As shown in FIG. 3, the residual score Q' stays in the abnormality determination line (average value of residual scores+ 12σ) L, that is, the abnormality determination can be performed. As shown in FIG. 3, even after second to fourth cleaning, the residual score Q' stays in the abnormality determination line L like the first cleaning, and the abnormality determination is possible.

Figure 4:
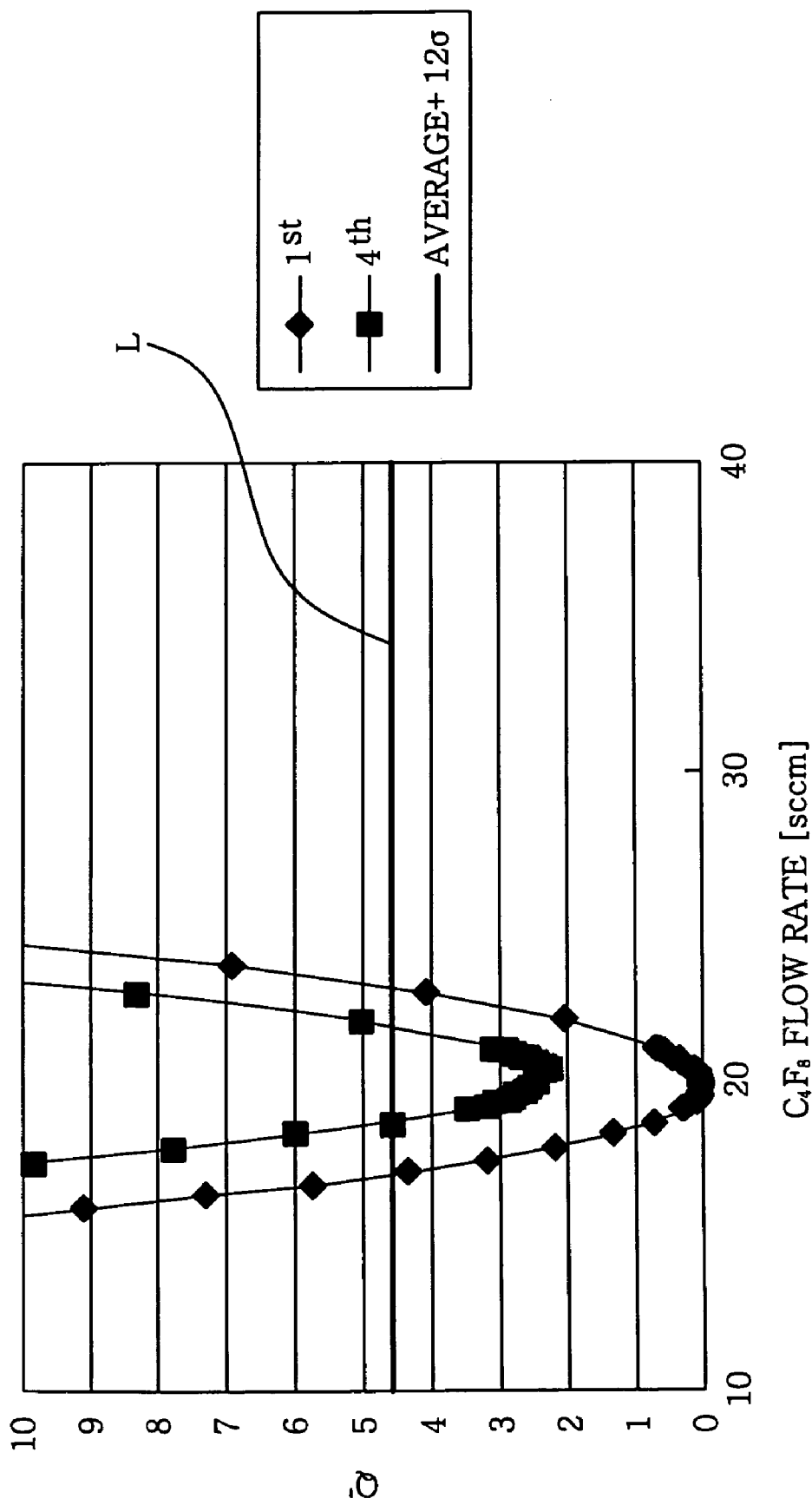
FIG. 4 shows relationships between a flow rate of $C_4F_8$ gas and a residual score in a plurality of low-residual component wavelengths for the plasma processing apparatus before and after the cleaning in accordance with the first preferred embodiment.

Further, it is verified as to whether or not a process variation of the plasma processing apparatus 10 (e.g., the process abnormality due to an abnormal deviation of the flow rate of the processing gas) can be validly inspected, with use of only 40 component wavelengths with small residual variations out of 128 component wavelengths. For example, FIG. 4 shows a relationship between an obtained residual score Q' and a flow rate of $C_4F_8$, which is one of processing gases, while deviating only the flow rate thereof from the center condition. Further, in FIG. 4, $1^{st}$ indicates before the cleaning, and $4^{th}$ indicates after three cleanings.

In accordance with FIG. 4, the residual scores Q' of the plasma processing apparatus 10 after the cleaning show generally high values than those before the cleaning. However, the residual score Q' after the cleaning even stays in the abnormality determination line L at a flow rate at or near the center condition (the bottom of the parabola), while the residual score Q' exceeds the abnormality determination line L if the flow rate further increases or decreases. Accordingly, it has been verified that the abnormality of the flow rate of the $C_4F_8$ gas, i.e., the process abnormality can be inspected.

However, if residual scores Q are obtained for the cases before and after the cleaning with all of the 128 component wavelengths in the whole area, although the process abnormality can be determined before the cleaning, the residual score Q exceeds the abnormality determination line L even at the center condition after the cleaning. That is, the proper process abnormality (the abnormality of the flow rate of the $C_4F_8$ gas) cannot be determined.

Accordingly, it has been verified that the process abnormality can be determined more reliably by selecting and using the component wavelengths with small residual variations, and detecting a variation of the residual score Q' thereof.

Figure 6:
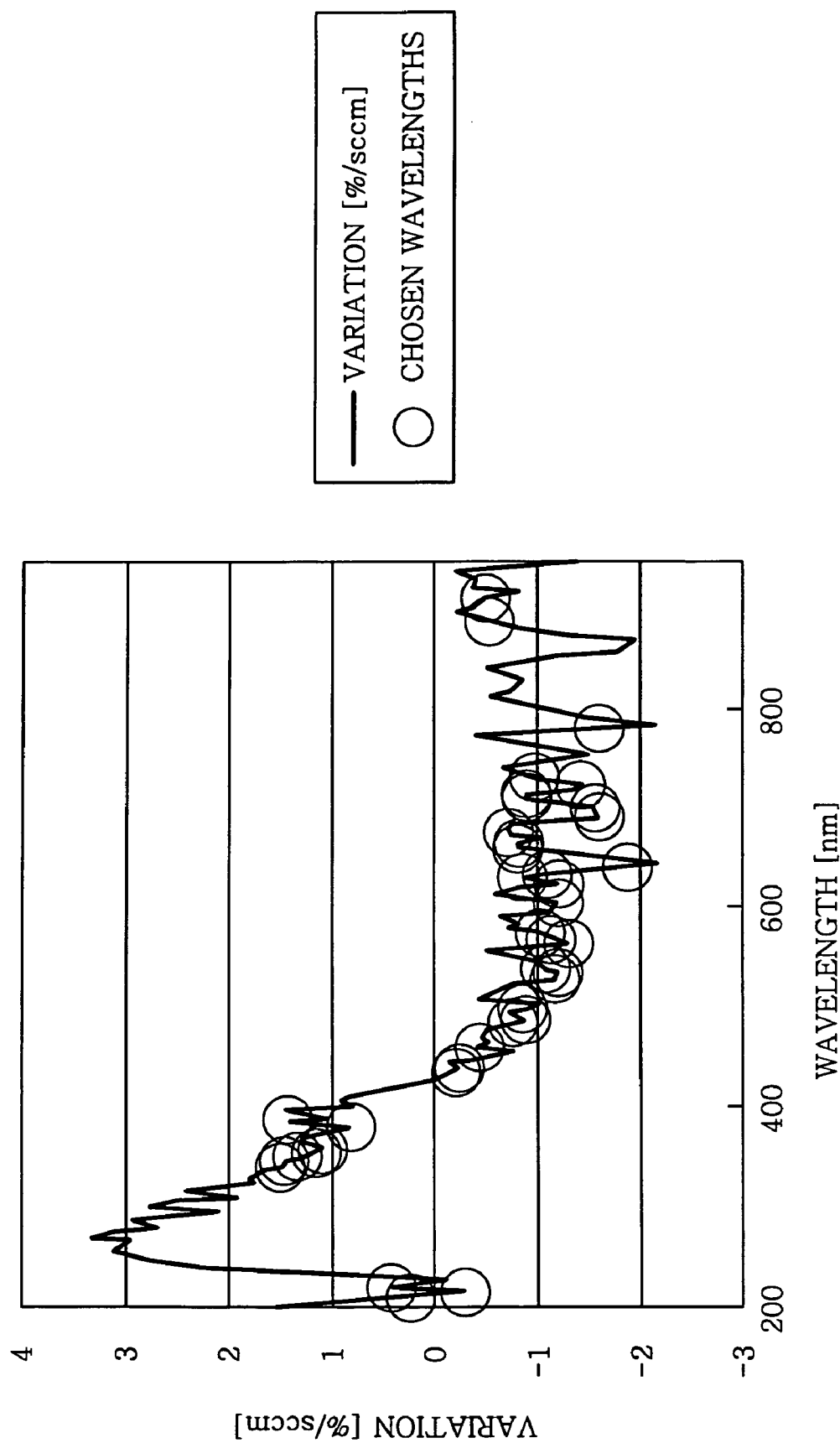
FIG. 6 illustrates a relationship between a component wavelength in the plasma emission and a variation ratio of the emission intensity over a flow rate variation, in each of the component wavelengths in accordance with the first preferred embodiment.

Then, emission intensity variations of respective component wavelengths over a flow rate variation (%/sccm) were obtained for all of the component wavelengths. The result is shown in FIG. 6. With reference to FIG. 6, the emission intensities in respective component wavelengths change respectively in accordance with the gas flow rate variations. Then, even for the component wavelengths with small residuals in accordance with the present preferred embodiment (in FIG. 6, shown by surrounding O), variations of the emission intensities appear clearly. Accordingly, it can be verified that the process abnormality can be inspected.

As explained above, in accordance with the present preferred embodiment, an abnormal flow rate of the processing gas can be inspected more reliably, since a variation, due to cleaning, of the residual score for each of the wafers are greatly suppressed even in case of the plasma processing apparatus after the cleaning, by selecting 40 component wavelengths with small residuals out of 128 component wavelengths of the plasma emission, obtaining a residual score thereof, and determining the process abnormality with use of the residual score.

In the above experiment in accordance with the first preferred embodiment, it was clarified that the process abnormality can actually inspected for a case having a flow rate deviation of some processing gas during the processing. Hereinafter, another experiment as follows was performed to verify that the abnormality inspection method in accordance with the present invention is also effective for a case wherein the processing gas and other processing conditions vary together.

With use of the following plasma processing apparatus (a plasma processing apparatus of a dual frequency application mode, in which different high frequency powers are respectively applied to upper and lower electrodes) before cleaning, after 25 wafers were processed (center experiment) in the following processing condition (center condition), plasma emission intensities in 128 component wavelengths were respectively detected as operating data just like in the above experiment. A principal component analysis was performed on the operating data up to $5^{th}$ principal components, and residual scores for respective wafers in the center experiment were obtained. Further, an average of residual scores for all the wafers (hereinafter, referred to as "average residual score") was obtained.

[Processing Condition]
wafer: 300 mm
etching film: silicon oxide film
base layer: silicon film
processing details: formation of a via hole
high frequency and power of power supply for upper electrode: 60 MHz, 3200 W
high frequency and power of power supply for lower electrode: 2 MHz, 3500 W
processing pressure: 20 mTorr
processing gas: $C_5F_8$=10 sccm, $CH_2F_2$=10 sccm, Ar=450 sccm, $O_2$=15 sccm, $N_2$=90 sccm
backside gas: He=20 mTorr (central portion of electrode), 40 mTorr (edge portion of electrode)
DC voltage on electrostatic chuck: 2.5 KV
Processing temperature: upper electrode=20° C., sidewall=60° C., lower electrode=60° C.

Further, with use of the plasma processing apparatus of the dual frequency application mode before the cleaning, 25 wafers were processed (sensitivity experiment) while concurrently varying, e.g., flow rate of a processing gas (e.g., $C_5F_8$ gas), a pressure in a processing chamber 11 and a power of the lower electrode 12 from the above processing condition and within a range from a normal value to an abnormal value in accordance with the following condition. Then, residual scores for respective wafers were obtained, and an average residual score for all of the wafers was obtained. Other than the following condition, it was set to be the center condition. Here, the sensitivity experiment is an experiment to observe a residual score variation over a process condition deviation from the center.

[Processing Condition]
upper electrode (60 MHz): 3100 W, 3300 W
lower electrode (2 MHz): 3400 W, 3600 W
processing pressure: 20 mTorr, 25 mTorr
processing gas: $C_5F_8$=10 sccm, 14 sccm,
    $CH_2F_2$=8 sccm, 14 sccm
    Ar=350 sccm, 550 sccm
    $O_2$=11 sccm, 18.5 sccm
    $N_2$=70 sccm, 90 sccm Next, a center experiment and a sensitivity experiment were performed just like the cases before the cleaning, with use of the identical plasma processing apparatus 10 after the cleaning, and average residual scores for respective experiments were obtained. Average residual scores for 128 component wavelengths in the center experiment and the sensitivity experiment before and after the cleaning are shown as the model 1 in the following table 1.

Further, as a method for selecting component wavelengths with relatively small residual variations, the present preferred embodiment adopted a method of narrowing down component wavelengths with reference to the maximum value and the minimum value of residuals for respective component wavelengths in the center experiment with use of 128 component wavelengths before the cleaning. For example, component wavelengths were narrowed down stepwise with use of 100%, 80%, 60%, 40% and 20% of the maximum value (0.43 in the present preferred embodiment) and the minimum value (−0.67 in the present preferred embodiment) of residuals in respective wavelengths. In the following table 1, average residual scores of 32 component wavelengths in a range of minimum value (before the cleaning)<residual (after the cleaning)<maximum value (before the cleaning) are represented as model 2; average residual scores of 25 component wavelengths in a range of 0.8×minimum value<residual<0.8×maximum value are represented as model 3; average residual scores of 15 component wavelengths in a range of 0.6×minimum value<residual<0.6×maximum value are represented as model 4; average residual scores of 9 component wavelengths in a range of 0.4×minimum value<residual<0.4×maximum value are represented as model 5; average residual scores of 3 component wavelengths in a range of 0.2×minimum value<residual<0.2×maximum value are represented as model 6.

TABLE 1

| Model | Condition of residuals for selecting wavelengths | Before cleaning | | After cleaning | |
|---|---|---|---|---|---|
| | | Center experiment | Sensitivity experiment | Center experiment | Sensitivity experiment |
| Model 1 | All component wavelengths | 0.19761 | 1799.49317 | 352.27600 | 1144.49198 |
| Model 2 | Minimum < residual < maximum | 0.02189 | 174.12854 | 2.22076 | 137.38920 |
| Model 3 | 0.8 × minimum < residual < 0.8 × maximum | 0.01426 | 118.76458 | 1.23486 | 93.39507 |
| Model 4 | 0.6 × minimum < residual < 0.6 × maximum | 0.00832 | 68.62816 | 0.35215 | 54.11313 |
| Model 5 | 0.4 × minimum < residual < 0.4 × maximum | 0.00499 | 39.53572 | 0.13226 | 32.72268 |
| Model 6 | 0.2 × minimum < residual < 0.2 × maximum | 0.00189 | 16.12629 | 0.06487 | 12.98660 |

As shown in the table 1, the average residual scores of the center experiment after the cleaning are much larger than those before the cleaning.

Figure 7:
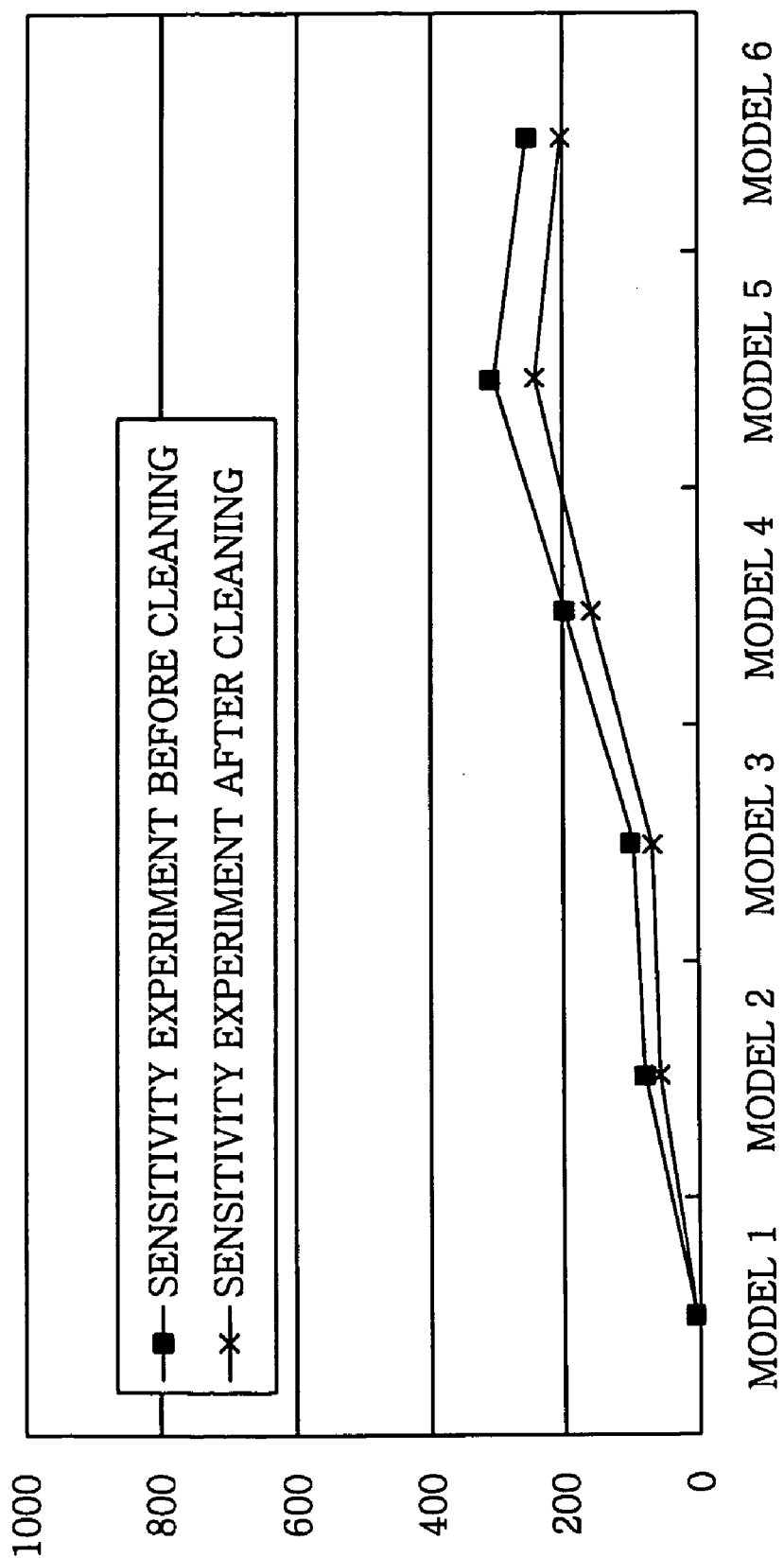
FIG. 7 shows unvarying indexes of residual scores in sensitivity experiments for the plasma processing apparatus before and after the cleaning in accordance with the first preferred embodiment.

Therefore, the following table 2 was constructed to evaluate the average residual scores of the sensitivity experiment before and after the cleaning based on the variations of the average residual scores of the center experiment between before and after the cleaning. The values in the following table 2 represent unvarying indexes, i.e., the average residual scores of the sensitivity experiment before and after the cleaning divided by the above-mentioned variations. The variation due to the cleaning has a smaller influence on the average residual scores before and after the cleaning, as the unvarying index becomes larger. In accordance with the result shown in the following table 2, the variation due to the cleaning gives a suppressed influence on the average residual scores after the cleaning from the average residual scores before the cleaning in models 2 to 6, wherein component wavelengths with small residuals are selected. Consequently, even if detected values of endpoint detector 19 after the cleaning are different from those before the cleaning, the process abnormality can be reliably inspected. Furthermore, in case only component wavelengths with smaller residuals were selected, it can be recognized that the variation due to the cleaning shows smaller influence on the average residual scores of the sensitivity experiment. The case that shows the smallest influence of the variation due to the cleaning is model 5, which is constructed from the component wavelengths with the second smallest residual range. It was recognized that selecting only component wavelengths with smaller residuals is not good due to the influence of noise. In FIG. 7, the result of the following table 2 is illustrated.

As explained above, in accordance with the present preferred embodiment, since residual scores were obtained by using only component wavelengths with small residuals while processing wafers with use of an plasma processing apparatus before and after cleaning, a process abnormality can be inspected without an influence from the difference between detected values of an endpoint detector 19 before and after the cleaning (caused by the cleaning).

Further, in accordance with the present preferred embodiment, while selecting component wavelengths with small residuals, the maximum value and the minimum value of the residuals are referred in order to select the component wavelengths with small residuals, thereby enabling a narrowing down of the component wavelengths (data) easily.

Furthermore, in accordance with the present preferred embodiment, since residual scores for respective wafers are used, if a wafer is acknowledged to have a residual score deviating unexpectedly, it can be easily recognized which detected value is abnormal by checking each of the detected values for the wafer.

TABLE 2

| Model | Condition of residuals for selecting wavelengths | Before cleaning Sensitivity experiment | After cleaning Sensitivity experiment |
|---|---|---|---|
| Model 1 | All component wavelengths | 5.11106 | 3.25067 |
| Model 2 | Minimum < residual < maximum | 79.19020 | 62.48188 |
| Model 3 | 0.8 × minimum < residual < 0.8 × maximum | 97.29993 | 76.51552 |
| Model 4 | 0.6 × minimum < residual < 0.6 × maximum | 199.59656 | 157.38138 |
| Model 5 | 0.4 × minimum < residual < 0.4 × maximum | 310.64299 | 257.11108 |
| Model 6 | 0.2 × minimum < residual < 0.2 × maximum | 256.07794 | 206.22111 |

Moreover, although the example of a detector was an endpoint detector in each of the experiments in accordance with the present preferred embodiment, any detector attached to the plasma processing apparatus can be expected to have the same effect with the present preferred embodiment. In addition, although the plasma processing apparatus was used as an example for an explanation, the present invention can be applied also to a semiconductor manufacturing apparatus or another general production apparatus that processes a plurality of objects to be processed.

Hereinafter, the present invention is explained based on a second preferred embodiment thereof shown in FIGS. 8 to 11.

First, an example of plasma processing apparatus, which is used for a processing result prediction method in accordance with the present invention, is explained with reference to FIG. 8.

Figure 8:
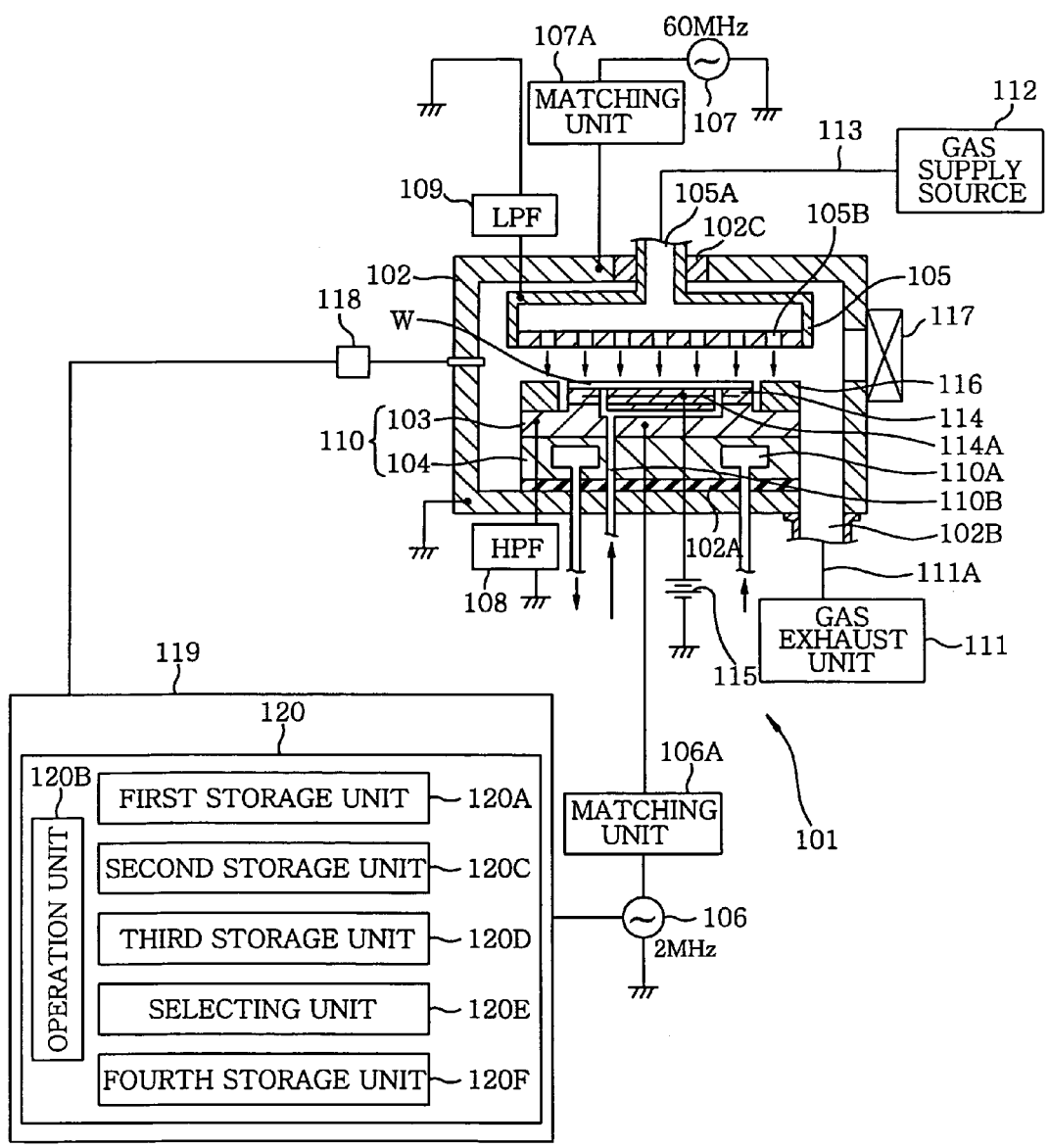
FIG. 8 shows an outline configuration of an example of plasma processing apparatus, to which a process prediction method in accordance with a second preferred embodiment of the present invention is applied.

As shown in FIG. 8, the plasma processing apparatus 101 in accordance with the present preferred embodiment includes a processing chamber 102 that can maintain a desired high vacuum level. The surface of the processing chamber 102 is alumite-processed and is electrically grounded. At the center of the bottom surface in the processing chamber 102, there is arranged a lower electrode 103 on which an object to be processed (e.g., a wafer having a thermal oxide layer) W is mounted. The lower electrode 103 is supported by a supporting body 104 that is arranged through an insulation member 102A on the bottom surface of the processing chamber 102. A upper electrode 105 having a hollow shape is prepared facing the lower electrode 103 via a gap, for plasma processing (etching), or the like, the thermal oxide layer of the wafer W. To the lower electrode 103, a high frequency power supply 106 of, e.g., 2 MHz is coupled through a matching unit 106A. To the upper electrode 105, a high frequency power supply 107 of a higher frequency, e.g., 60 MHz, than that of the lower electrode 103 is coupled through a matching unit 107A. The lower electrode 103 is grounded through a high pass filter 108, and the upper electrode 105 is grounded through a low pass filter 109. Further, to a gas exhaust port 102B formed at the bottom surface of the processing chamber 102, a gas exhaust unit 111 is connected through a gas exhaust pipe 111A. The gas exhaust unit 111 can exhaust the inside of the processing chamber 102, to maintain a desired vacuum level. Generally, the lower electrode 103 and the supporting body 104 are combined to be called as a mounting table 110.

At the center of the top surface of the upper electrode 105, a gas inlet line 105A is connected. The gas inlet line 105A passes through an opening of an insulation member 102C, which is arranged at the center of the top surface of the processing chamber 102. To the gas inlet line 105A, a gas supply source 112 is coupled through a gas supply line 113. More specifically, the gas supply source 112 includes a gas 1 (e.g., $C_6F_8$) supply source, a gas 2 (e.g., $CH_2F_2$) supply source, a gas 3 (e.g., $N_2$) supply source, a gas 4 (e.g., Ar) supply source and a gas 5 (e.g., $O_2$) supply source. Each of the gas supply sources is connected to the gas supply line 113. These gases are supplied as an etching gas with a predetermined flow rate into the processing chamber 102 through a flow rate control device.

At the bottom surface of the upper electrode 105, a multitude of openings are formed with a uniform dispersion. Thereby, a processing gas can be supplied from the openings 105B into the processing chamber 102 with a uniform dispersion. Therefore, a predetermined etching gas can be supplied with a predetermined flow rate from the gas supply source 112, while the gas exhaust unit 111 exhausts the inside of the processing chamber. By applying respective high frequency powers to the lower electrode 103 and the upper electrode 105 in such condition, a plasma of the etching gas is generated in the processing chamber 102. As a result, a predetermined etching processing is performed on a wafer W on the lower electrode 103.

A temperature sensor (not shown) is mounted to the lower electrode 103. With the temperature sensor, the temperature of the wafer W on the lower electrode 103 can be always monitored In the mounting table 110, a coolant path 110A is formed through which a predetermined coolant (e.g., a conventionally known fluorine-based fluid, water, or etc.) runs. Due to the coolant flowing through the coolant path 110A, the lower electrode 103 is cooled down, and the wafer W is cooled down through the lower electrode 103. Accordingly, the wafer W can be controlled to have a desired temperature.

Further, an electrostatic chuck 114 made of an insulating material is disposed on the lower electrode 103. An electrode plate 114A in the electrostatic chuck 114 is coupled to a high voltage DC power supply 115. A static electricity is generated on the surface of the electrostatic chuck 114 due to a high voltage applied from the high voltage DC power supply 115 to the electrode plate 114A, and the electrostatic chuck 114 electrostatically adsorb the wafer W. At an outer periphery of the lower electrode 103, a focus ring 116 is arranged to surround the electrostatic chuck 114. From the effect of the focus ring 116, the plasma can be converged to the wafer W.

At the mounting table 110, a gas flow path 110B for supplying a thermal conductive gas, such as He gas etc., as a backside gas is formed. The gas flow path 110B has openings at multiple places in the top surface of the mounting table 110. Corresponding to the locations of the openings of the gas flow path 110B, the electrostatic chuck 114 on the mounting table 110 has through openings. As a result, if the backside gas is supplied through the gas flow path 110B of the mounting table 110, the backside gas flows out from the gas flow path 110B through the through openings of the electrostatic chuck 114, and the backside gas is diffused uniformly in the entire gap between the electrostatic chuck 114 and the wafer W. Consequently, a thermal conductivity can be increased. Further, in FIG. 8, reference numeral 117 represents a gate valve that opens and closes the loading/unloading port of the wafer W, which is formed at the processing chamber 102.

An endpoint detector 118 is attached to the plasma processing apparatus 101. With use of the endpoint detector 118, plasma emission in the processing chamber 102 is detected for each wafer W. Plasma emission intensities in respective component wavelengths for each wafer are taken into a control device 119 individually as detected data. In the control device, there is prepared a multivariate analysis unit, which stores a multivariate analysis program, and executes a multivariate analysis such as a principal component analysis of the detected data through the program. As the detected data, for example, 150 kinds of component wavelengths in the range of 200 nm~950 nm are used.

However, after various components or detectors are detached and re-attached in the maintenance such as cleaning etc., detected values often change. Consequently, if the model equation constructed before the maintenance is used, it is impossible to evaluate an apparatus status of the plasma processing apparatus, to predict a processing result, and/or to predict a process, after such maintenance.

The multivariate analysis unit 120 used in the present preferred embodiment includes a first storage unit 120A for storing a program that performs a principal component analysis on detected data, which includes emission intensities in multiple component wavelengths from multiple detectors (the endpoint detector 118, in the present preferred embodiment), wherein the intensities are obtained by performing a standard processing under a predetermined condition as described above on a plurality of wafers W in the processing chamber; an operation unit 120B that constructs a principal component analysis model with use of the program in the first storage unit 120A based on the detected data including the emission intensities in a plurality of component wavelengths, and that obtains residuals of the principal component analysis model as a first residuals; a second storage unit 120C for storing the first residuals obtained by the operation unit 120B; a third storage unit 120D for storing second residuals, which is obtained by applying detected data to the principal component analysis model, wherein the detected data are obtained from the endpoint detector 118 by performing a processing with an identical condition to the standard condition in the plasma processing apparatus 101, which has a different status in the processing chamber 102, such as components, attachment status of components, surface status in the processing chamber 102 etc., due to, e.g., a maintenance; a selecting unit 120E for selecting detected data with small variations of the second residuals, based on variations of the first residuals; and a fourth storage unit 120F for storing a program that constructs a multivariate analysis model (e.g., a multiple regression analysis model) with use of the residuals of a plurality of detected data selected by the selecting unit 120E.

In the multivariate analysis unit 120 in accordance with the present preferred embodiment, the following processing is executed. That is, with use of a processing unit of a plasma processing apparatus 101 (e.g., a plasma processing apparatus before cleaning), the wafers W are processed in a standard condition, and plasma emission intensities (optical data) in respective wavelengths are detected as detected data for each of the wafers by the endpoint detector 118. The operation unit 120B performs the principal component analysis on the detected data with use of the program in the first storage unit 120A, thereby to construct a principal component analysis model. Thereafter, residuals for respective detected data are obtained based on the principal component analysis model, and are stored as the first residuals in the second storage unit 120C. Next, wafers are processed in the standard condition with use of another plasma processing apparatus of the same kind (e.g., the plasma processing apparatus after a cleaning procedure). Then, plasma emission intensities in respective wavelengths are detected for each of the wafers by the endpoint detector 118, which has a different installation status due to the cleaning etc. The detected data are applied to the principal component analysis model, to obtain the second residuals. The second residuals are stored in the third storage unit 120D. Among the second residuals, the selecting unit 120E selects only detected data with small variations of the second residuals based on the maximum value and the minimum value of the first residuals. Thereafter, in order to evaluate the apparatus status, by using the program of the fourth storage unit 120F with employing process parameters as object variables and employing the selected second residuals with small variations as explanatory variables, a new model equation is constructed by the multivariate analysis. By using the new model equation, the process parameters can be predicted with a high accuracy. That is, the apparatus status can be evaluated with a high accuracy.

In this case, a principal component analysis employing detected data including plasma emission intensities is briefly explained. First, with use of a plasma processing apparatus 101 before a cleaning procedure, process parameters are set to be standard values as shown in the following table 3. In this standard condition, 7 wafers are respectively etched as normal wafers as shown in the following table 4. During the etching, the endpoint detector 118 detects emission intensities in n component wavelengths for each of the normal wafers as detected data individually. Then, a principal component analysis is performed on the detected data.

TABLE 3

|  | Pressure (mTorr) | Upper electrode (W) | Lower electrode (W) | Gas 1 (sccm) | Gas 2 (sccm) | Gas 3 (sccm) | Gas 4 (sccm) | Gas 5 (sccm) |
| --- | --- | --- | --- | --- | --- | --- | --- | --- |
| Standard value | 20 | 3200 | 3500 | 10 | 10 | 90 | 450 | 15 |
| Level 1 | 20 | 3100 | 3400 | 10 | 8 | 70 | 350 | 11 |
| Level 2 | 25 | 3300 | 3600 | 14 | 14 | 90 | 550 | 18.5 |

TABLE 4

| Orthogonal arrays Wafer No. | Pressure mTorr | Upper electrode W | Lower electrode W | Gas 1 sccm | Gas 2 sccm | Gas 3 sccm | Gas 4 sccm | Gas 5 sccm |
|---|---|---|---|---|---|---|---|---|
| 1 Normal wafer | 20 | 3200 | 3500 | 10 | 10 | 90 | 450 | 15 |
| 2 Normal wafer | 20 | 3200 | 3500 | 10 | 10 | 90 | 450 | 15 |
| 3 Normal wafer | 20 | 3200 | 3500 | 10 | 10 | 90 | 450 | 15 |
| 4 Normal wafer | 20 | 3200 | 3500 | 10 | 10 | 90 | 450 | 15 |
| 5 Normal wafer | 20 | 3200 | 3500 | 10 | 10 | 90 | 450 | 15 |
| 6 Normal wafer | 20 | 3200 | 3500 | 10 | 10 | 90 | 450 | 15 |
| 7 Normal wafer | 20 | 3200 | 3500 | 10 | 10 | 90 | 450 | 15 |
| 8 Orthogonal arrays wafer (L1) | 25 | 3100 | 3600 | 10 | 14 | 90 | 550 | 11 |
| 9 Orthogonal arrays wafer (L2) | 25 | 3300 | 3400 | 10 | 14 | 70 | 550 | 11 |
| 10 Orthogonal arrays wafer (L3) | 20 | 3100 | 3400 | 10 | 8 | 90 | 550 | 18.5 |
| 11 Orthogonal arrays wafer (L4) | 25 | 3300 | 3400 | 14 | 8 | 90 | 350 | 11 |
| 12 Orthogonal arrays wafer (L5) | 25 | 3300 | 3600 | 10 | 8 | 70 | 350 | 18.5 |
| 13 Orthogonal arrays wafer (L6) | 25 | 3100 | 3600 | 14 | 8 | 70 | 550 | 18.5 |
| 14 Orthogonal arrays wafer (L7) | 20 | 3300 | 3600 | 14 | 8 | 90 | 550 | 11 |
| 15 Orthogonal arrays wafer (L8) | 25 | 3100 | 3400 | 14 | 14 | 90 | 350 | 18.5 |
| 16 Orthogonal arrays wafer (L9) | 20 | 3300 | 3400 | 14 | 14 | 70 | 550 | 18.5 |
| 17 Orthogonal arrays wafer (L10) | 20 | 3300 | 3600 | 10 | 14 | 90 | 350 | 18.5 |
| 18 Orthogonal arrays wafer (L11) | 20 | 3100 | 3400 | 10 | 8 | 70 | 350 | 11 |
| 19 Orthogonal arrays wafer (L12) | 20 | 3100 | 3600 | 14 | 14 | 70 | 350 | 11 |

In the above-described principal component analysis, for example, if n detected values x (150 component wavelengths in accordance with the present preferred embodiment) are detected for each of m wafers (19 wafers in accordance with the present preferred embodiment), a matrix including components of the detected data $x_{ij}$, is expressed as Eq. 12.

$$X = \begin{bmatrix} x_{11} & x_{12} & \cdots & x_{1n} \\ x_{21} & x_{22} & \cdots & x_{2n} \\ \vdots & \vdots & \cdots & \vdots \\ x_{m1} & x_{m2} & \cdots & x_{mn} \end{bmatrix} \quad \text{Eq. 12}$$

Then, in the multivariate analysis unit 120 of the control device 119, the average value, the maximum value, the minimum value and the variance for the detected values are calculated. Thereafter, with use of a variance-covariance matrix based on the calculated values, a principal component analysis on multiple operating data is performed, to obtain eigenvalues and eigenvectors thereof.

The eigenvalue indicates the magnitude of the variance of respective operating data. Then, the first principal component, the second principal component, ... and the $n^{th}$ principal component are defined in the decreasing order of the eigenvalue. Further, each of the eigenvalues has an eigenvector associated thereto. The eigenvector becomes a weighting coefficient for respective detected data. In general, as the degree of the principal component increases (as the eigenvalue decreases), a contribution rate for an evaluation of data becomes lower, and the usefulness is reduced.

As described above, if n detected values are adopted for each of m wafers, the $j^{th}$ principal component $t_{ij}$ corresponding to the $j^{th}$ eigenvalue for the $i^{th}$ wafer is expressed as Eq. 13.

$$t_{ij} = X_{i1}P_{j1} + X_{i2}P_{j2} + \ldots + X_{in}P_{jn} \quad \text{Eq. 13}$$

Then, the value, obtained by assigning the concrete detected values for $i^{th}$ wafer $(x_{i1}, x_{i2}, \ldots, x_{in})$ to the equation of the $j^{th}$ principal component $t_{ij}$, becomes a score for the $j^{th}$ principal component of the $i^{th}$ wafer. Therefore, the score for the $j^{th}$ principal component $t_j$ is defined by Eq. 14, and the eigenvector for the $j^{th}$ principal component $P_j$ is defined by Eq. 15.

$$t_j = \begin{bmatrix} t_{ij} \\ t_{2j} \\ \vdots \\ t_{mj} \end{bmatrix} \qquad \text{Eq. 14}$$

$$P_j = \begin{bmatrix} P_{j1} \\ P_{j2} \\ \vdots \\ P_{jn} \end{bmatrix} \qquad \text{Eq. 15}$$

The score for the $j^{th}$ principal component $t_j$ can be expressed as Eq. 16 with use of the matrix X and the eigenvector $P_j$. Further, the matrix X can be expressed as Eq. 17 with use of scores for the principal components $t_i$ and the respective eigenvectors $P_i$ of them.

$$t_j = XP_j \qquad \text{Eq. 16}$$

$$X = t_1 P_1^T + t_2 P_2^T + \ldots + t_n P_n^T \qquad \text{Eq. 17}$$

wherein $P_n^T$ is a transposed matrix for $P_n$.

Meanwhile, in case of predicting the process as described above, a residual matrix is constructed by merging high-degree principal components after a principal component analysis is performed. A principal component analysis is performed for principal components, e.g., up to the $k^{th}$ one, which are considered to have high contribution rates, and principal components with a high degree being greater than k, which have lower contribution rates than that of the $k^{th}$ principal component, are merged to construct the residual matrix E defined in Eq. 18, wherein each column corresponds to each component wavelength of plasma emission, and each row corresponds to the number of wafers. By applying the residual matrix E to Eq. 17, the residual matrix E can be expressed as Eq. 19.

$$E = \begin{bmatrix} e_{11} & e_{12} & \cdots & e_{1n} \\ e_{21} & e_{22} & \cdots & e_{2n} \\ \vdots & \vdots & \cdots & \vdots \\ e_{m1} & e_{m2} & \cdots & e_{mn} \end{bmatrix} \qquad \text{Eq. 18}$$

$$E = X - (t_1 P_1^T + t_2 P_2^T + \ldots + t_k P_k^T) \qquad \text{Eq. 19}$$

Up to what degree of principal components should be obtained in a principal component analysis is determined by a cross-validation method. In this case, such a degree that gives the smallest prediction error is obtained. As a result, although depending on kinds of detected data, it was recognized that up to $5^{th}$ principal components is enough in a case of optical data as in the present preferred embodiment. Then, variations of residuals of respective detected data for 7 normal wafers were obtained with the plasma processing apparatus 101 before the cleaning procedure. Further, the maximum value and the minimum value of the residuals were obtained. In this case, the maximum value was 0.43 and the minimum value was −0.67.

Figure 9:
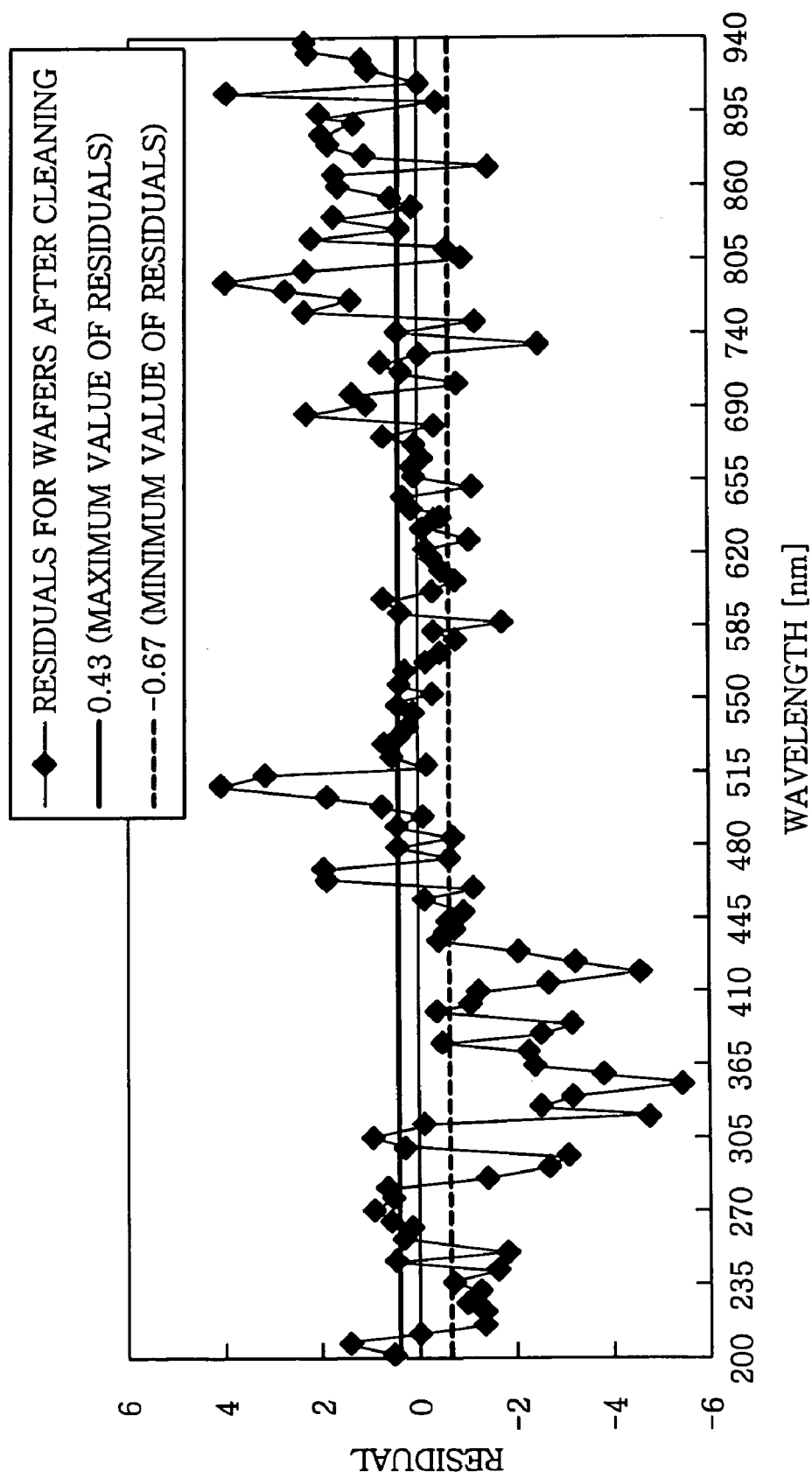
FIG. 9 shows residual variations in respective component wavelengths of plasma emission within a wavelength range of 200 nm~950 nm, wherein the plasma emission is detected by an endpoint detector attached to the plasma processing apparatus after a cleaning procedure in accordance with the second preferred embodiment.

Next, with use of the plasma processing apparatus after the cleaning, 7 wafers were respectively processed as normal wafers under the standard condition shown in the table 3. Then, like the above-described case, plasma emission intensities in respective component wavelengths were detected by the endpoint detector 118. Residuals of normal wafers were obtained by applying the detected data to Eq. 19. The result is shown in FIG. 9. In FIG. 9, the maximum value and the minimum value of the residuals of the normal wafers before the cleaning are marked as critical lines. As can be recognized in FIG. 9, there are many detected data (component wavelengths) that have residuals varying to exceed the critical lines. The emission intensities in wavelength components that exceed the critical lines are considered to increase the prediction error in case of predicting the process of the plasma processing apparatus after the cleaning. Accordingly, in the present preferred embodiment, only component wavelengths with residuals staying in the critical lines, among residuals of detected data obtained with the plasma processing apparatus after the cleaning, are selected. Then, a multivariate analysis, e.g., multiple regression analysis is performed with employing the residuals as explanatory variables, to construct a new model equation. With use of the new model equation, process parameters are predicted.

Figure 10:
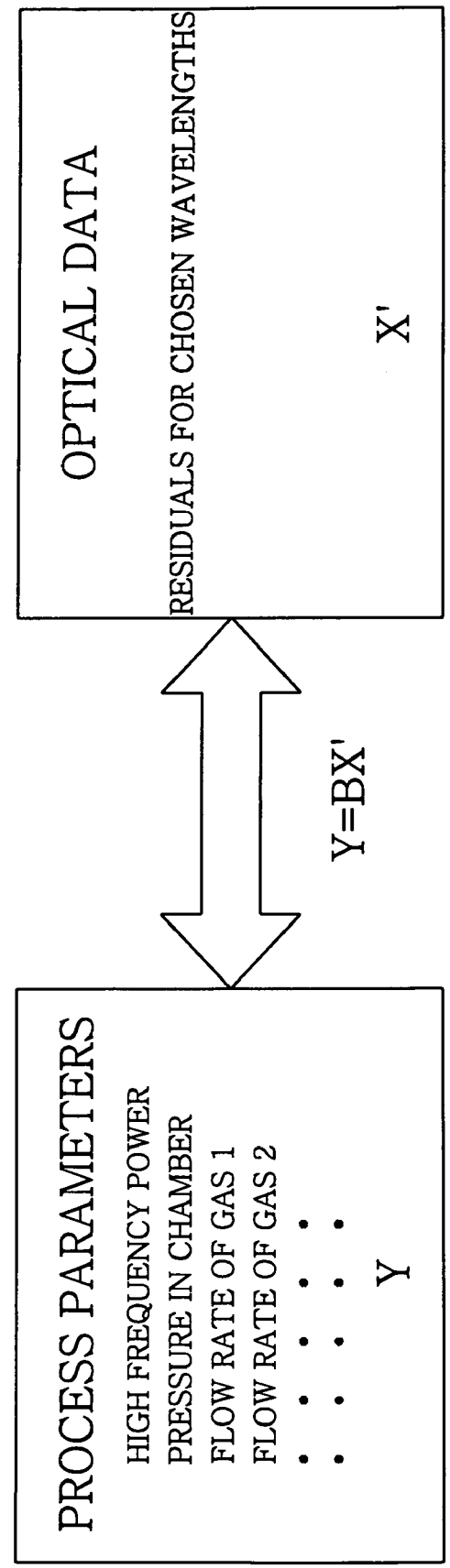
FIG. 10 provides a method for constructing a model that is used in the process prediction method in accordance with the second preferred embodiment.

That is, in accordance with the present preferred embodiment, as shown in FIG. 10, a multiple regression analysis is performed with use of a multivariate analysis program, with employing residuals, which are selected as above-described, as explanatory variables, and with employing process parameters as objective variables. Hence, the following multiple regression equation (model equation) Eq. 20 is constructed for the plasma processing apparatus 101 before the cleaning. To construct the model equation, normal wafers and orthogonal arrays wafers (with process parameters set along an orthogonal arrays of Taguchi method in the ranges of level 1 to level 2 in the table 3) shown in the table 4 are processed before the cleaning. A model equation is constructed with use of residuals of detected data obtained by the processing (residuals of detected data selected by the above-described method) and setting of the process parameters during the processing. Then, to obtain a regression matrix B of the model equation, the partial least squares (PLS) method of the multivariate analysis program was used.

$$Y = BX \qquad \text{Eq. 20}$$

Figure 5:
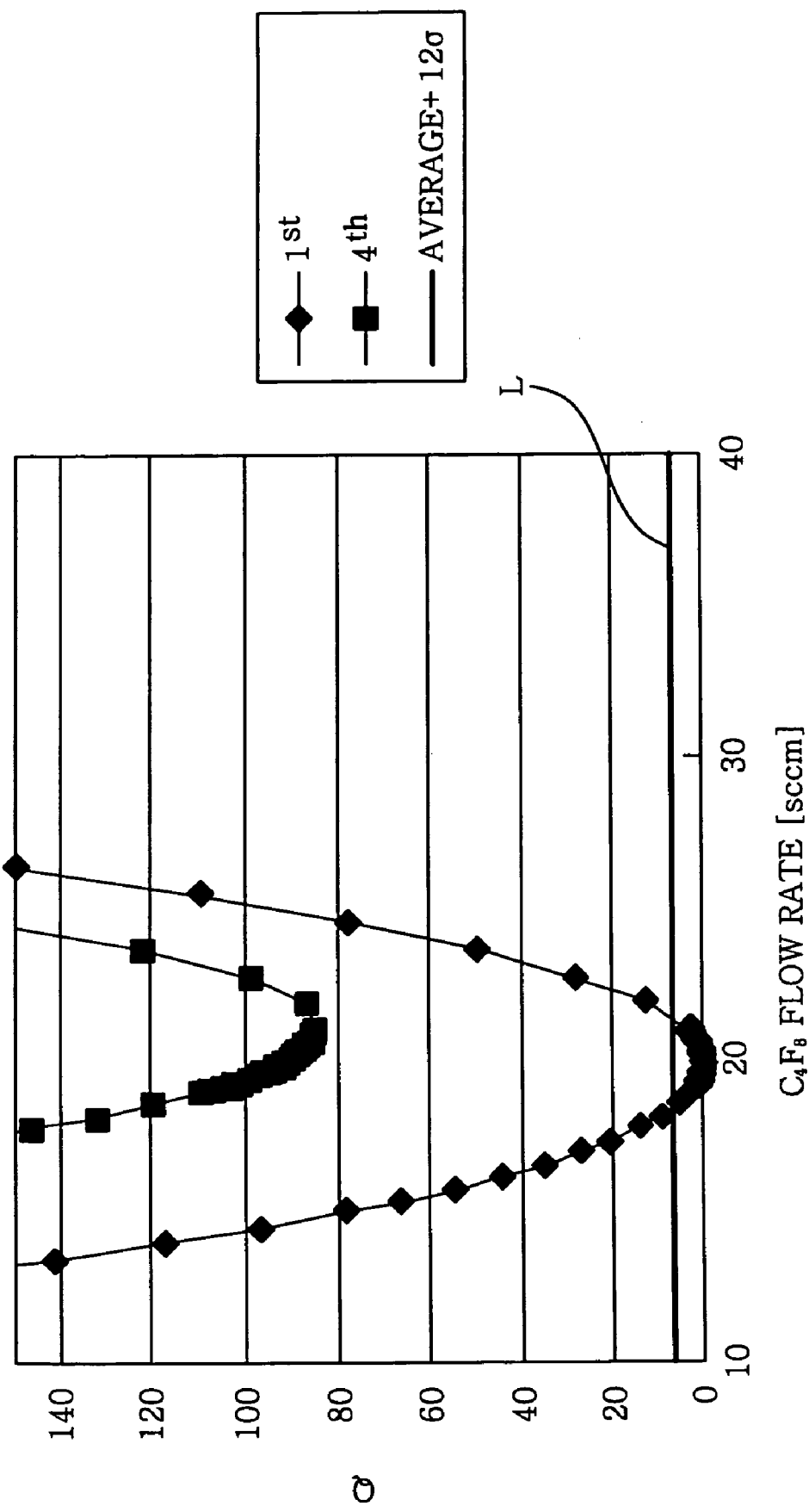
FIG. 5 shows relationships between a flow rate of $C_4F_8$ gas and a residual score of all component wavelengths for the plasma processing apparatus before and after the cleaning in accordance with the first preferred embodiment.
Figure 11:
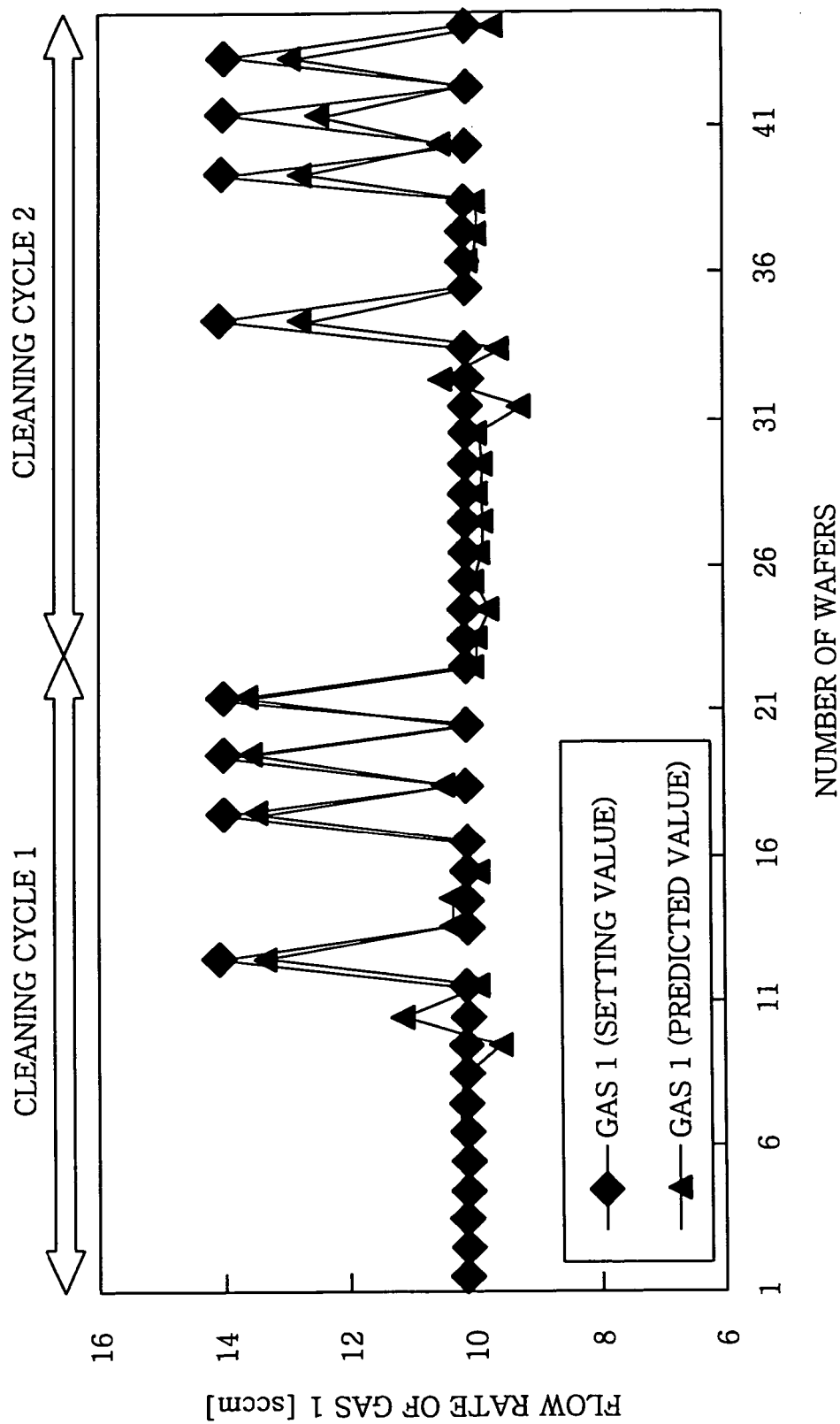
FIG. 11 shows set values and predicted values of a process parameter of the plasma processing apparatus before and after the cleaning, the predicted values being predicted with use of the process prediction method in accordance with the second preferred embodiment.
Figure 12:
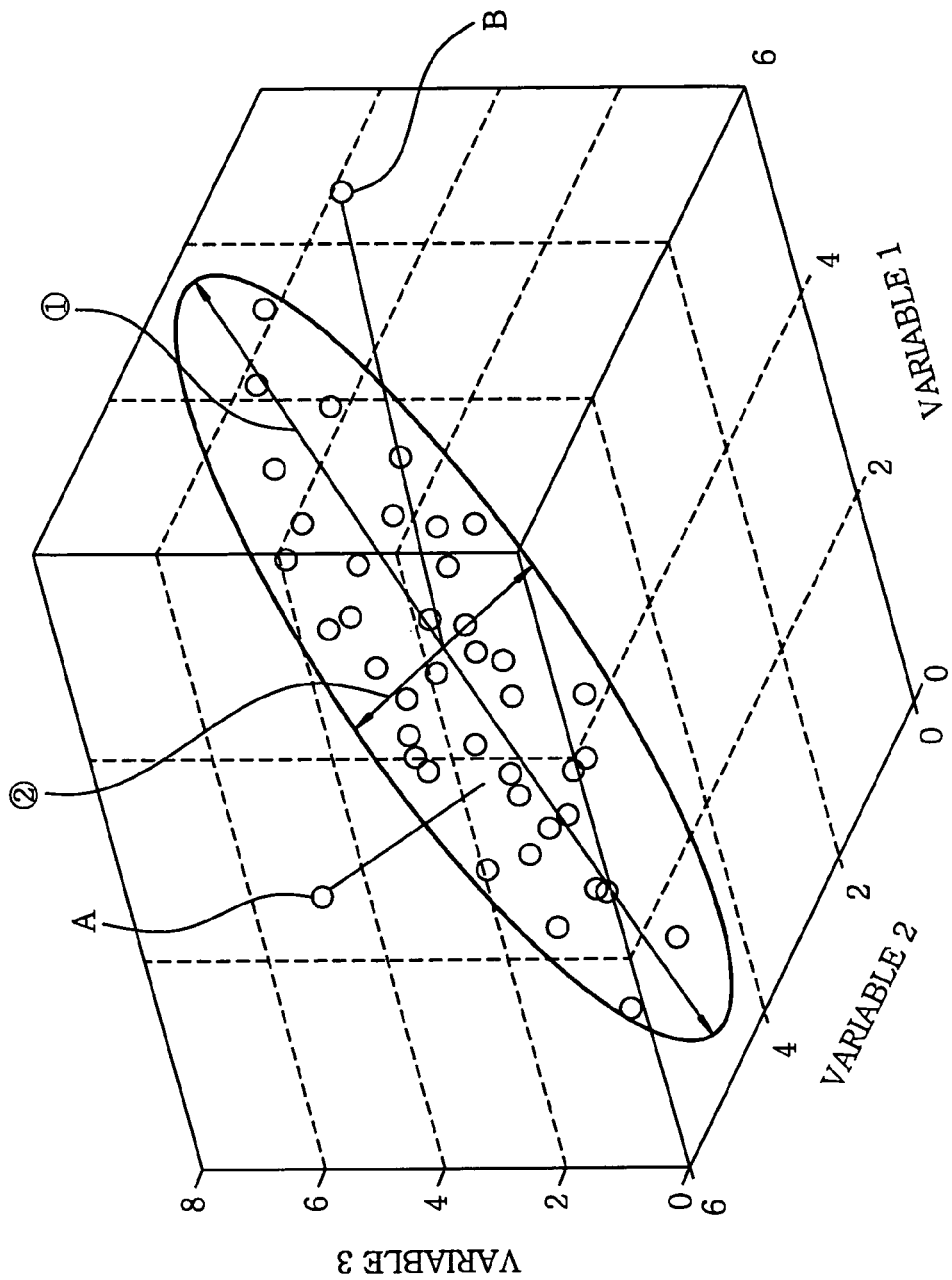
FIG. 12 conceptually shows a principal component analysis.

After constructing the model equation Eq. 20, a control device applies residuals of the detected data selected among the respective component wavelengths of plasma emission for 7 normal wafers and 15 abnormal wafers shown in FIG. 5, which were previously processed with use of the plasma processing apparatus 101 before the cleaning, to the model equation Eq. 20, thereby to automatically calculate the process parameters of the plasma processing apparatus 101 before the cleaning, and to automatically generate the predicted values. That is, it predicts the process parameters. One of the process parameters, e.g., a flow rate of gas 1, is shown in the left half of FIG. 11 as a cleaning cycle 1. As shown in FIG. 11, like the conventional case, the setting values of the flow rate of the gas 1, which are set as a process parameter, and the predicted values, which are obtained by a calculation, are similar. In this way, it is recognized that even in case of using residuals of some detected data selected among a plurality of detected data, the predicted value has a high accuracy.

TABLE 5

| Wafer No. | Pressure (mT) | Upper electrode (W) | Lower electrode (W) | Gas 1 (sccm) | Gas 2 (sccm) | Gas 3 (sccm) | Gas 4 (sccm) | Gas 5 (sccm) |
|---|---|---|---|---|---|---|---|---|
| 1 Normal wafer | 20 | 3200 | 3500 | 10 | 10 | 90 | 450 | 15 |
| 2 Normal wafer | 20 | 3200 | 3500 | 10 | 10 | 90 | 450 | 15 |
| 3 Normal wafer | 20 | 3200 | 3500 | 10 | 10 | 90 | 450 | 15 |
| 4 Normal wafer | 20 | 3200 | 3500 | 10 | 10 | 90 | 450 | 15 |
| 5 Normal wafer | 20 | 3200 | 3500 | 10 | 10 | 90 | 450 | 15 |
| 6 Normal wafer | 20 | 3200 | 3500 | 10 | 10 | 90 | 450 | 15 |
| 7 Normal wafer | 20 | 3200 | 3500 | 10 | 10 | 90 | 450 | 15 |
| 8 Abnormal wafer | 20 | 3200 | 3600 | 10 | 10 | 90 | 450 | 15 |
| 9 Abnormal wafer | 20 | 3100 | 3500 | 10 | 10 | 90 | 350 | 18.5 |
| 10 Abnormal wafer | 20 | 3300 | 3500 | 10 | 10 | 70 | 450 | 15 |
| 11 Abnormal wafer | 20 | 3200 | 3500 | 10 | 14 | 80 | 450 | 15 |
| 12 Abnormal wafer | 20 | 3200 | 3500 | 14 | 10 | 90 | 550 | 11 |
| 13 Abnormal wafer | 25 | 3300 | 3500 | 10 | 10 | 90 | 450 | 15 |
| 14 Abnormal wafer | 20 | 3200 | 3500 | 10 | 8 | 90 | 450 | 18.5 |
| 15 Abnormal wafer | 25 | 3200 | 3500 | 10 | 10 | 80 | 350 | 15 |
| 16 Abnormal wafer | 20 | 3100 | 3500 | 10 | 10 | 70 | 450 | 15 |
| 17 Abnormal wafer | 20 | 3200 | 3500 | 14 | 10 | 90 | 450 | 15 |
| 18 Abnormal wafer | 25 | 3300 | 3600 | 10 | 10 | 90 | 550 | 15 |
| 19 Abnormal wafer | 20 | 3200 | 3400 | 10 | 10 | 90 | 450 | 15 |
| 20 Abnormal wafer | 25 | 3200 | 3400 | 10 | 10 | 70 | 350 | 15 |
| 21 Abnormal wafer | 20 | 3200 | 3500 | 14 | 10 | 80 | 450 | 15 |
| 22 Abnormal wafer | 20 | 3200 | 3500 | 10 | 14 | 90 | 350 | 11 |

Next, with use of the plasma processing apparatus after the cleaning, the normal wafers and the abnormal wafers shown in the table 5 were respectively processed. Then, the control device of the plasma processing apparatus after the cleaning applies residuals of detected data selected among component wavelengths of plasma emission of respective wafers to the model equation Eq. 20, and generates automatically predicted values, i.e., predicts the process parameters. Among the process parameters, set values and predicted values of the flow rate of the gas 1 are shown in the right half of FIG. 11 as a cleaning cycle 2. As shown in FIG. 11, even after the cleaning, the set values of the flow rate of the gas 1, which are set as a process parameter, and the predicted values, which are obtained by a calculation, are similar. In this way, it is possible to predict the process parameters as high accuracy as the case before the cleaning, i.e., to predict the process parameters with much higher accuracy than the conventional case. Then, accordingly, as shown in FIG. 11, the process parameters can be predicted with a high accuracy in both of the cleaning cycles 1 and 2. Even if the model equation is constructed with the plasma processing apparatus 101 before the cleaning, and the model equation without modification is applied for the plasma processing apparatus after the cleaning, the process parameters can be predicted with a high accuracy.

Then, prediction errors of respective process parameters were obtained with use of the Eq. 21. The result is shown in the following tables 6 and 7. The following table 6 shows the prediction errors, and the following table 7 shows the prediction accuracies.

$$\text{Prediction error} = \sqrt{\Sigma(\text{setting}-\text{predicted value})^2/n} \qquad \text{Eq. 21,}$$

wherein n is the number of wafers.

As shown in the following tables 6 and 7, in case of the gas 1 shown in FIG. 11, the predicted value by the prediction method in accordance with the present preferred embodiment has an error of 0.4 sccm with respect to the setting value of 10 sccm, i.e., it was predicted with an error of 4% over the setting value. In contrast, the predicted value by the conventional prediction method has an error of 1.7 sccm with respect to the setting value of 10 sccm, i.e., has an error of 17% over the setting value. Hence, it is recognized that the prediction accuracy of the conventional method is much lower than the method in accordance with the present preferred embodiment. Further, as shown in the following tables 6 and 7, for other process parameters also, the prediction accuracies of the prediction method in accordance with the present preferred embodiment are much higher than those of the conventional method.

TABLE 6

|  | Pressure (mT) | Upper electrode (W) | Lower electrode (W) | Gas 1 (sccm) | Gas 2 (sccm) | Gas 3 (sccm) | Gas 4 (sccm) | Gas 5 (sccm) |
| --- | --- | --- | --- | --- | --- | --- | --- | --- |
| Embodiment | 0.6 | 41.2 | 41.8 | 0.4 | 0.5 | 3.5 | 17.6 | 1.5 |
| Conventional | 1.0 | 256.4 | 90.1 | 1.7 | 1.4 | 15.3 | 72.1 | 4.0 |

TABLE 7

| Setting | Pressure 20 mT | Upper electrode 3200 W | Lower electrode 3500 W | Gas 1 10 sccm | Gas 2 19 sccm | Gas 3 90 sccm | Gas 4 450 sccm | Gas 5 15 sccm |
| --- | --- | --- | --- | --- | --- | --- | --- | --- |
| Embodiment | 3% | 1% | 1% | 4% | 5% | 4% | 4% | 10% |
| Conventional | 5% | 8% | 3% | 17% | 14% | 17% | 16% | 27% |

As explained above, the present preferred embodiment includes a process wherein a standard processing is performed on multiple wafers W with use of the plasma processing apparatus 101 before the cleaning; a process wherein the operation unit 120B performs the principal component analysis with use of the program of the first storage unit 120A on the detected data, which includes plasma emission intensities in multiple component wavelengths obtained by the standard processing, to obtain the principal component analysis model (Eq. 17), and obtains the residuals for the detected data respectively as the first residuals; a process wherein the first residuals are stored in the second storage unit 120C; a process wherein the standard processing identical with the case before the cleaning is performed on a plurality of wafers with use of the plasma processing apparatus after the cleaning; a process wherein the operation unit 120B obtains residuals of a plurality of detected data, which are obtained by the standard processing, as the second residuals with use of the detected data and the principal component analysis model (Eq. 17); a process wherein the second residuals are stored in the third storage unit 120D; a process wherein the selecting unit 120E selects detected data with residuals of small variations out of the second residuals based on the maximum value and the minimum value of the first residual variations; and a process wherein the regression model Eq. 20 is constructed through the program of the fourth storage unit 120F with use of a plurality of the selected residuals. In this way, in accordance with the regression model Eq. 20, residual variations of detected data before and after the cleaning become small. Therefore, irrespective of before and after the cleaning, the process parameters of the plasma processing apparatus can be predicted with a high accuracy. Further, it is not necessary to repeatedly construct a prediction model equation for a multivariate analysis in every cleaning, but if a model equation is once constructed for the plasma processing apparatus 101 before the cleaning, it is possible to use the intact model equation for the plasma processing apparatus after the cleaning. Therefore, time and efforts to construct the model equation can be reduced.

Further, in accordance with the second preferred embodiment, while performing the principal component analysis, the degree of the principal component (e.g., the 5$^{th}$ principal component) having a small prediction error is obtained with use of the cross-validation method. For this reason, a residual matrix E with a small prediction error can be obtained with a high efficiency. Further, since the maximum value and the minimum value of residuals before the cleaning are used as the standard for selecting detected data with small residual variations, detected data with small residuals can be routinely selected with a high efficiency, and it is possible to reliably construct a model equation with a high prediction accuracy. Further, the standard for selecting the detected data may be values obtained by multiplying each of the maximum value and the minimum value of residuals before the cleaning by a predetermined rate.

In accordance with each of the preferred embodiments, although the detected data from the endpoint detector were used as an example of the detector for the explanation, detected data from other detectors attached to the plasma processing apparatus can be used to have the same effect on the preferred embodiments. Further, although the preferred embodiments explained a case of predicting process parameters to evaluate the apparatus status, it is possible to construct a multiple regression analysis model for predicting processing results of wafers in accordance with the present invention. Furthermore, although the preferred embodiments explained a method for predicting a process of a plasma processing apparatus before and after a cleaning procedure, the present invention can be applied to a plasma processing apparatus after another maintenance procedure other than cleaning. Moreover, with respect to plasma processing apparatuses of the same kind, if a model is constructed for a plasma processing apparatus, the model can be applied to another plasma processing apparatus of the same kind. Further, in accordance with the preferred embodiments, although a plasma processing apparatus was used as an example for explanation, the present invention can be applied also to a semiconductor manufacturing apparatus or another general production apparatus that processes multiple objects to be processed other than the plasma processing apparatus.

Further, in accordance with the second preferred embodiment, normal wafers, orthogonal arrays wafers and abnormal wafers were processed before the cleaning, while normal wafers and abnormal wafers were processed after the cleaning. However, it is also possible to increase the prediction accuracy by processing normal wafers before and after the cleaning, selecting component wavelengths with small residual variations, and performing a wafer processing to construct a model equation of a multiple regression analysis after the cleaning.

While the invention has been shown and described with respect to the preferred embodiments, it will be understood by those skilled in the art that various changes and modifications may be made without departing from the spirit and scope of the invention as defined in the following claims.

What is claimed is:

1. A method for predicting a processing result, comprising:
a process of performing a predetermined first standard processing on a plurality of objects to be processed with use of a first processing apparatus set in a certain condition;
a process of obtaining a plurality of detected data from a plurality of detectors provided at the first processing apparatus during the first standard processing;
a process of performing a principal component analysis on the plurality of detected data obtained during the first standard processing, to construct a principal component analysis model;
a process of obtaining residuals of the principal component analysis model as first residuals;
a process of performing a second standard processing, which is similar to the first standard processing, on a plurality of objects to be processed, which are similar to said the plurality of objects to be processed, with use of the first processing apparatus in another condition or another second processing apparatus of the same kind;
a process of obtaining a plurality of detected data from the plurality of detectors provided at the first processing apparatus or from a plurality of detectors provided at the second processing apparatus during the second standard processing;
a process of applying the plurality of detected data obtained during the second standard processing to the principal component analysis model, to obtain second residuals;
a process of selecting from the obtained second residuals those of the second residuals within a maximum and a minimum of the first residuals;
a process of weighting the selected second residuals, and constructing a new multivariate analysis model with use of the selected second residuals; and
a process of predicting a processing result of the second standard processing with use of the multivariate analysis model.

2. The processing result prediction method of claim 1, wherein the process of weighting applies weighting references which are binary references indicating whether or not each of the second residuals should be adopted.

3. The processing result prediction method of claim 2, wherein the process of weighting applies weighting references which are references to adopt second residuals with small variations.

4. The processing result prediction method of claim 3, wherein the process of weighting applies weighting references which are references to determine second residuals with small variations based on the maximum value and the minimum value of the first residuals.

5. The processing result prediction method of claim 1, wherein the process of performing the principal component analysis on the plurality of detected data obtained during the first standard processing, to construct the principal component analysis model includes a process of obtaining a degree of principal components with use of a cross-validation method.

6. The processing result prediction method of claim 1, wherein the process of obtaining the residuals of the principal component analysis model as the first residuals includes:
a process of dividing a result of the principal component analysis into principal components with high contribution rates and principal components with low contribution rates; and
a process of merging residuals of the principal components with low contribution rates into a residual matrix.

7. The processing result prediction method of claim 1, wherein the multivariate analysis model is a multiple regression analysis model.

8. The processing result prediction method of claim 1, wherein said a certain condition is a condition before a maintenance, and said another condition is a condition after the apparatus is changed due to the maintenance.

9. The processing result prediction method of claim 8, wherein said a condition in the apparatus includes attachment statuses of the respective detectors.

10. The processing result prediction method of claim 8, wherein said a condition in the apparatus includes a surface condition in the apparatus.

11. The processing result prediction method of claim 8, wherein the maintenance includes a cleaning of the apparatus.

12. The processing result prediction method of claim 1, wherein the processing apparatus is a plasma processing apparatus.

13. The processing result prediction method of claim 12, wherein both the detected data include data for plasma emission intensities.

14. An apparatus for predicting a processing result, comprising:
a unit for, while performing a predetermined first standard processing on a plurality of objects to be processed with use of a first processing apparatus set in a certain condition, performing a principal component analysis on a plurality of detected data obtained from a plurality of detectors provided at the first processing apparatus, to construct a principal component analysis model;
a unit for obtaining residuals of the principal component analysis model as first residuals;
a unit for, while performing a second standard processing, which is similar to the first standard processing, on a plurality of objects to be processed, which are similar to said the plurality of objects to be processed, with use of the first processing apparatus in another condition or another second processing apparatus of the same kind, applying a plurality of detected data, obtained from the plurality of detectors provided at the first processing apparatus or from a plurality of detectors provided at the second processing apparatus, to the principal component analysis model, to obtain second residuals;
a unit for selecting from the obtained second residuals those of the second residuals within a maximum and a minimum of the first residuals;
a unit for weighting the second residuals, and constructing a new multivariate analysis model with use of the selected second residuals; and
a unit for predicting a processing result of the second standard processing with use of the multivariate analysis model.

15. The processing result prediction apparatus of claim 14, wherein the unit for weighting applies weighting references which are binary references indicating whether or not each of the second residuals should be adopted.

16. The processing result prediction apparatus of claim 15, wherein the unit for weighting applies weighting references which are references to adopt second residuals with small variations.

17. The processing result prediction apparatus of claim 16, wherein the unit for weighting applies weighting references which are references to determine second residuals with small variations based on the maximum value and the minimum value of the first residuals.

18. The processing result prediction apparatus of claim 14, wherein the unit to construct the principal component analysis model includes a unit for obtaining a degree of principal components with use of a cross-validation method.

19. The processing result prediction apparatus of claim 14, wherein the unit for obtaining the residuals of the principal component analysis model as the first residuals includes:
- a unit for dividing a result of the principal component analysis into principal components with high contribution rates and principal components with low contribution rates; and
- a unit for merging residuals of the principal components with low contribution rates into a residual matrix.

20. The processing result prediction apparatus of claim 14, wherein the multivariate analysis model is a multiple regression analysis model.

21. The processing result prediction method of claim 4, wherein the selected second residuals which are greater than the minimum value of the first residuals and smaller than the maximum value of the first residuals are adopted.

22. The processing result prediction apparatus of claim 17, wherein the selected second residuals which are greater than the minimum value of the first residuals and smaller than the maximum value of the first residuals are adopted.

* * * * *